(12) United States Patent
Matsutori et al.

(10) Patent No.: US 7,784,640 B2
(45) Date of Patent: *Aug. 31, 2010

(54) LID ATTACHING MECHANISM WITH CAMMING UNIT FOR THIN-PLATE SUPPORTING CONTAINER

(75) Inventors: Chiaki Matsutori, Shisui-machi (JP); Tadahiro Obayashi, Shisui-machi (JP)

(73) Assignee: Miraial Co., Ltd. (JP)

( * ) Notice: Subject to any disclaimer, the term of this patent is extended or adjusted under 35 U.S.C. 154(b) by 969 days.

This patent is subject to a terminal disclaimer.

(21) Appl. No.: 10/896,913

(22) Filed: Jul. 23, 2004

(65) Prior Publication Data

US 2005/0133402 A1    Jun. 23, 2005

(30) Foreign Application Priority Data

Dec. 18, 2003    (JP)    ............... 2003-421491

(51) Int. Cl.
*B65D 43/04* (2006.01)
*B65D 85/86* (2006.01)
*B65D 45/28* (2006.01)

(52) U.S. Cl. ................ 220/806; 220/323; 206/710
(58) Field of Classification Search ........... 220/323, 220/324, 806; 206/710, 711; 292/33
See application file for complete search history.

(56) References Cited

U.S. PATENT DOCUMENTS

| 4,995,430 | A | | 2/1991 | Bonora et al. | |
|---|---|---|---|---|---|
| 5,193,707 | A | * | 3/1993 | Mizumura | .................. 220/326 |
| 5,740,845 | A | | 4/1998 | Bonora et al. | ............... 141/292 |
| 5,915,562 | A | | 6/1999 | Nyseth et al. | |
| 5,957,292 | A | | 9/1999 | Mikkelsen et al. | .......... 206/710 |
| 6,010,008 | A | * | 1/2000 | Nyseth et al. | ................ 206/711 |
| 6,419,482 | B1 | * | 7/2002 | Sakata et al. | ................. 432/250 |
| 2004/0124118 | A1 | | 7/2004 | Matsutori et al. | |

FOREIGN PATENT DOCUMENTS

| JP | 2000-058633 | 2/2000 |
|---|---|---|
| JP | 2001-512288 | 8/2001 |
| JP | 2003-174080 | 6/2003 |
| JP | 2003-174081 | 6/2003 |
| WO | WO 97/13947 | 4/1997 |
| WO | 98/56676 | 12/1998 |
| WO | 99/39994 | 8/1999 |

OTHER PUBLICATIONS

U.S. Appl. No. 10/768,031, filed Feb. 2, 2004, Matsutori et al.

* cited by examiner

*Primary Examiner*—Robin Hylton
(74) *Attorney, Agent, or Firm*—Bacon & Thomas, PLLC

(57) ABSTRACT

The attaching-and-detaching operation of a lid unit is automated using an existing attaching-and-detaching device. A lid unit for closing a container body of a thin-plate supporting container for use in storing semiconductor wafers therein is provided. A simplified attaching-and-detaching mechanism allows the lid unit to be attached and detached by easy locking and unlocking with respect to the container body. The simplified attaching-and-detaching mechanism includes a locking member engageable with a second receiving device of the container body, and a guiding member disposed at the extremity of the locking member, which guiding member reaches the second receiving device and guides the locking member into the second receiving device in a state in which the main body fits lightly in the container body. The guiding member includes a reaching portion that first reaches the second receiving device, and a guiding portion that guides the locking member to the second receiving device.

17 Claims, 18 Drawing Sheets

(A)

(B)

(C)

(D)

LID ATTACHING MECHANISM WITH CAMMING UNIT FOR THIN-PLATE SUPPORTING CONTAINER

CROSS-REFERENCE TO RELATED APPLICATION

This application claims, under 35 USC §119, the benefit of priority of Japanese Application No. 2003-421491 filed Dec. 18, 2003.

BACKGROUND OF THE INVENTION

1. Field of the Invention

The present invention relates to a lid unit for a thin-plate supporting container for use in storing or transporting thin plates such as semiconductor wafers, storage disks, liquid crystal glass substrates or the like, or for use in production processes of the thin plates.

2. Description of the Related Art

Thin-plate supporting containers for storage or transportation of thin plates such as semiconductor wafers or the like received therein are generally known.

Such a thin-plate supporting container mainly includes a container body and a lid unit for closing an opening on the top of the container body. In the container body, various members are provided to support thin plates such as semiconductor wafers or the like. The thin-plate supporting container must be transported with its interior maintained clean in order to prevent contamination of the surfaces of the thin plates such as the semiconductor wafers or the like received in the container. Hence, the container is hermetically sealed; that is, a lid unit is fixed to the container body for purposes of hermetical sealing. A variety of structures is known which can fix the lid unit to the container body.

The thin-plate supporting container transported to a plant for producing semiconductors or the like is placed on a production line where the lid unit is automatically attached or detached by the use of a specific apparatus.

A lid unit cooperative with the above specific apparatus is disclosed in Japanese Patent Laid-Open No. 2001-512288. As shown in FIG. 2 of the accompanying drawings, a lid unit 1 includes a main body 2, a cam member 3, a latch arm 4 and a fulcrum 5.

The cam member 3 is rotationally attached to the main body 2 and has a cam portion 6. The cam portion 6 is provided with a joint opening 7 in the shape of an elongated hole.

The latch arm 4 is provided at its proximal portion with an S-shaped cam follower portion 8, and the follower portion 8 is fitted to and caught in the joint opening 7.

The fulcrum 5 has a projecting member located on the main body 2 and supports the latch arm 4.

In this arrangement, when the cam member 3 rotates, the S-shaped cam follower 8 caught in the joint opening 7 is pressed upwardly while it is moving rightwards as seen in FIG. 2. Thus, the latch arm 4 rotates about the fulcrum 5 while it is extending from the main body 2 so that the extremity of the latch arm 4 is pressed downwardly.

At this time, the extremity of the latch arm 4 has fitted in a hole of the container body, and upon downward movement of the latch arm 4, the lid unit is pressed toward and fixed to the container body.

In the above-mentioned lid unit 1, the latch arm 4 extends from the main body 2 and fits at its extremity in the hole on the container body side. It is necessary, however, that the lid unit be placed in pressed condition with respect to the container body such that the latch arm 4 is allowed to extend from the main body 2. This is because a sealing member is disposed between the lid unit and the container body to seal the container body hermetically. The sealing member is formed from a synthetic resin or the like and is of a resilient character, and hence, pushes back the lid unit having fitted in the container body. Thus, the lid unit should be placed in pressed condition toward the container body to extend the latch arm 4 from the main body 2.

In this instance, when an attempt is made to attach the lid unit to the container body in a state in which the container body is oriented laterally (a state in which the semiconductor wafers or the like are oriented in the horizontal direction), the container body results in displacement. In attaching of the lid unit to the container body, the lid unit should be maintained in pressed condition toward the container body as noted above. However, the container body when oriented laterally becomes displaced since it has nothing that holds the container body. This leaves a problem in that it is difficult to achieve automatic attachment and detachment of the lid unit.

SUMMARY OF THE INVENTION

In view of the foregoing circumstances, it is an object of the present invention to provide a lid unit for a thin-plate supporting container in which the lid unit can easily be attached without pressing the same toward the container body.

According to an aspect of the present invention, there is provided a lid unit for a thin-plate supporting container for closing a container body of the thin-plate supporting container to be transported with a thin plate received therein, comprising a simplified attaching-and-detaching mechanism provided in a main body of the lid unit, which constitutes an outer shell of the lid unit, and allowing the lid unit to be attached and detached by easy locking and unlocking with respect to the container body, wherein the simplified attaching-and-detaching mechanism includes a locking member disposed to extend from the main body engageable with a receiving device on the container body, and a guiding member provided at the extremity of the locking member which reaches the receiving device in a state in which the main body fits lightly in the container body, and guides the locking member into the receiving device.

In this arrangement, when the locking member of the simplified attachment-and-detachment mechanism is extended outwardly from the main body without pressing imposed on the container body, in a state in which the main body fits lightly in the container body, the guiding member provided at the extremity of the locking member first reaches the receiving device. In this state, upon further extension of the locking member from the main body, the guiding member guides the locking member into the receiving device, and the locking member fits into the receiving device.

DESCRIPTION OF THE PREFERRED EMBODIMENTS

Figure 1:
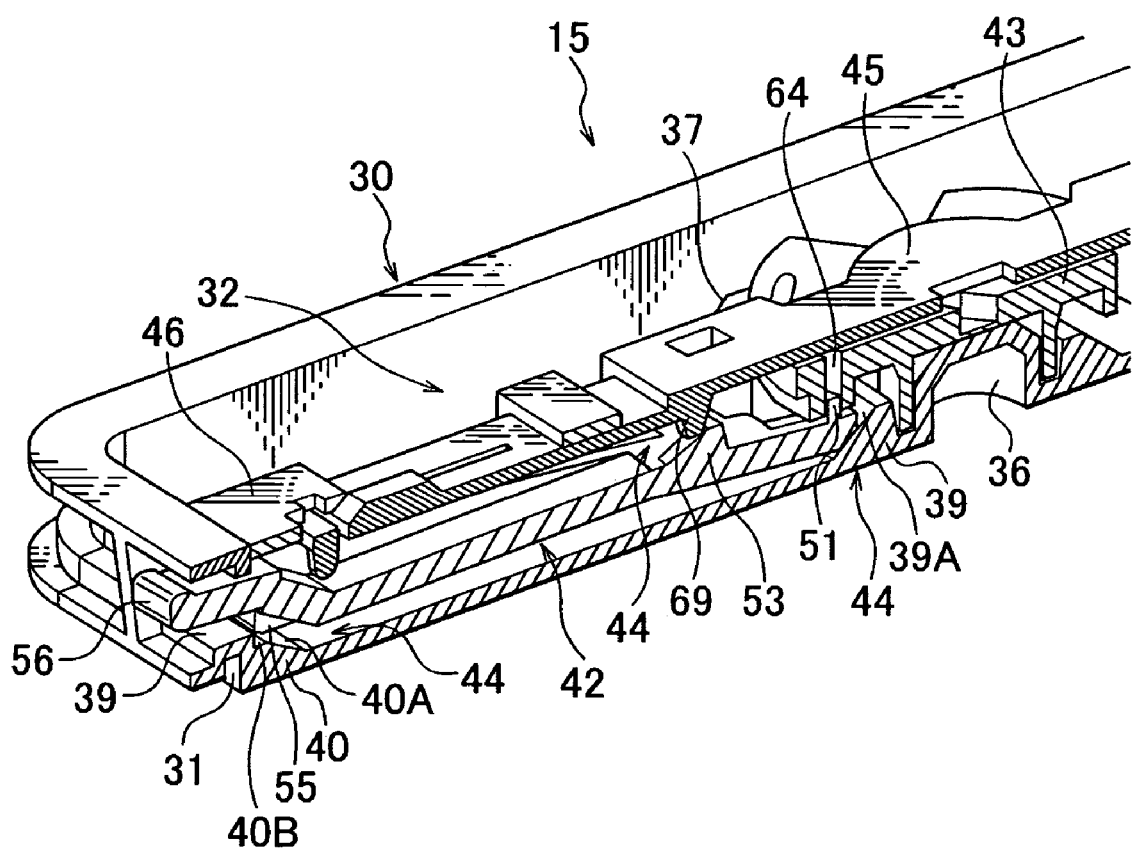
FIG. 1 is a perspective view showing important portions of a simplified attachment-and-detachment mechanism of a lid unit for use in a thin-plate supporting container according to one preferred embodiment of the present invention.
Figure 2:
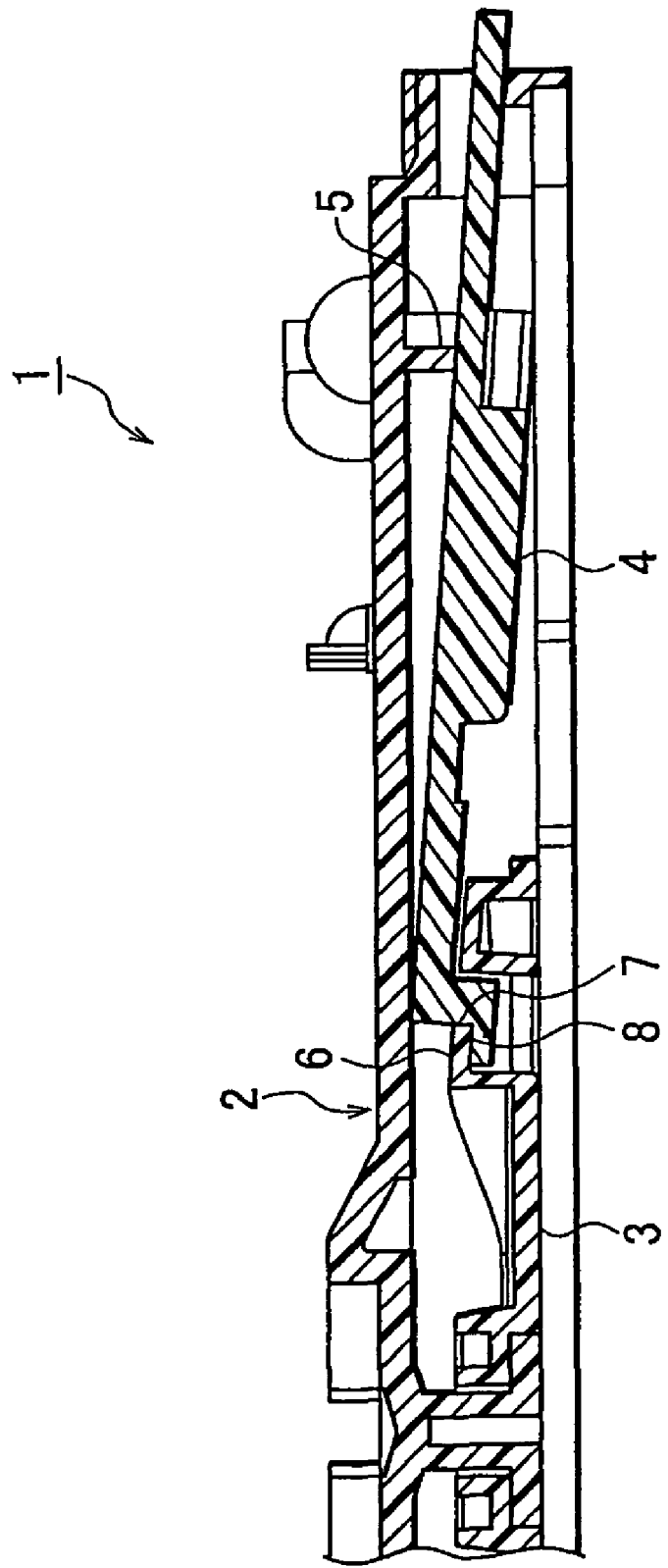
FIG. 2 is a cross-sectional side view showing a conventional lid unit for a thin-plate supporting container.

The present invention will now be described by referring to the drawings and by giving some preferred embodiments of the invention.

A thin-plate supporting container of the present invention is a container for use in storing or transporting thin plates such as semiconductor wafers, storage disks, liquid crystal glass substrates or the like, or for use in production lines of the thin plates. Note that this embodiment illustrates, as an example, a thin-plate supporting container for receiving semiconductor wafers. Numerous types of lid units are known which are used to close a thin-plate supporting container, two types of which are shown herein.

A thin-plate supporting container 11 according to this embodiment includes a container body 12 for receiving a multiplicity of semiconductor wafers 49 (see FIG. 26), two thin-plate supporting units 13 provided on two opposite side walls in the container body 12 and supporting from both sides the semiconductor wafers 49 received therein, a first lid unit 14, and a second lid unit 15 for closing the container body 12, a top flange 16 to be clamped by an arm portion of a transporting device (not shown) in a plant, and carrying handles 17 to be held by the operator who hand-carries the thin-plate supporting container 11, as shown in FIG. 3 to FIG. 10.

Figure 3:
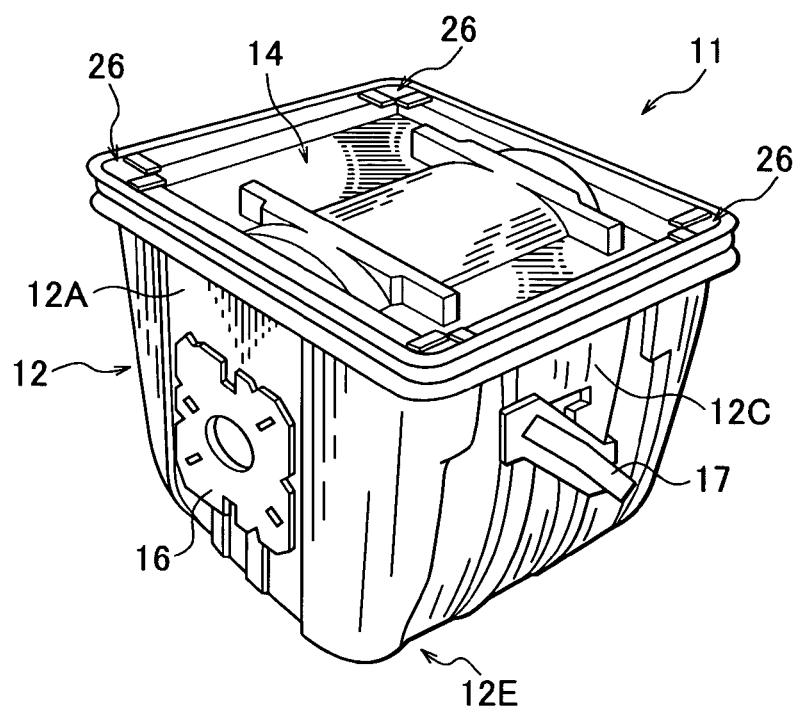
FIG. 3 is a perspective view showing a thin-plate supporting container according to the embodiment of the invention.
Figure 4:
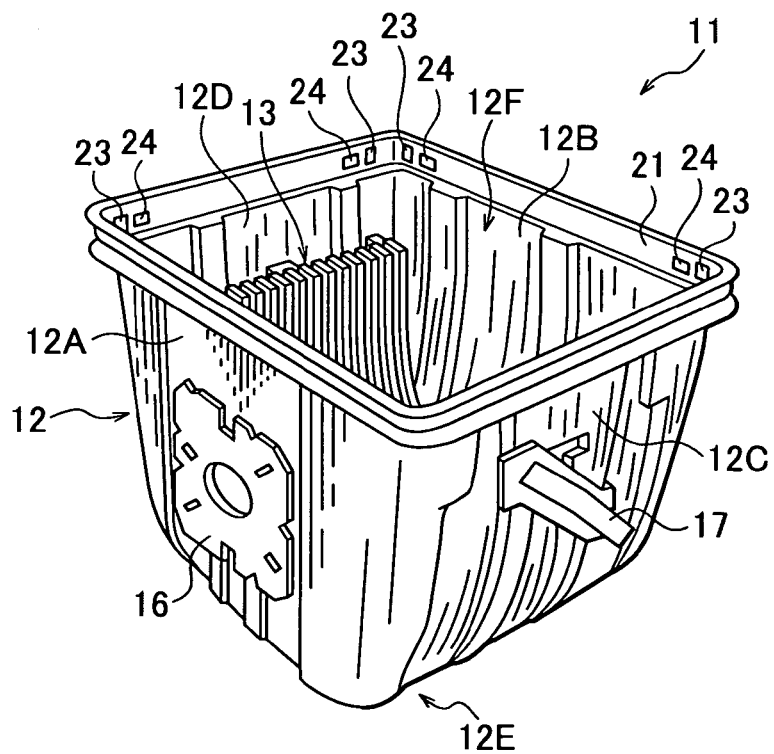
FIG. 4 is a perspective view of the thin-plate supporting container according to the embodiment of the invention with the lid unit removed.

The container body 12 is formed generally in a cubic shape on the whole as shown in FIG. 3 and FIG. 4. The container body 12 includes four side walls 12A, 12B, 12C, 12D which correspond to the surrounding walls of that body, and a bottom plate 12E in a state in which the container body 12 is oriented vertically (a state shown in FIG. 3 and FIG. 4), and further includes an opening 12F formed on the top thereof. The container body 12 is oriented laterally when installed to face a wafer transferring robot (not shown) in a production line of the semiconductor wafers 49. On the outside of the side wall 12A which corresponds to the bottom in a state in which the container body 12 is oriented laterally, there is provided positioning means (not shown) of the thin-plate supporting container 11. On the outside of the side wall 12A which corresponds to the ceiling in a state in which the container body 12 is oriented laterally, a top flange 16 is disposed which is detachably attached thereon. On the outer side of the side walls 12C, 12D which correspond to the lateral walls in a state in which the container body 12 is oriented laterally, carrying handles 17 are detachably attached.

Figure 5:
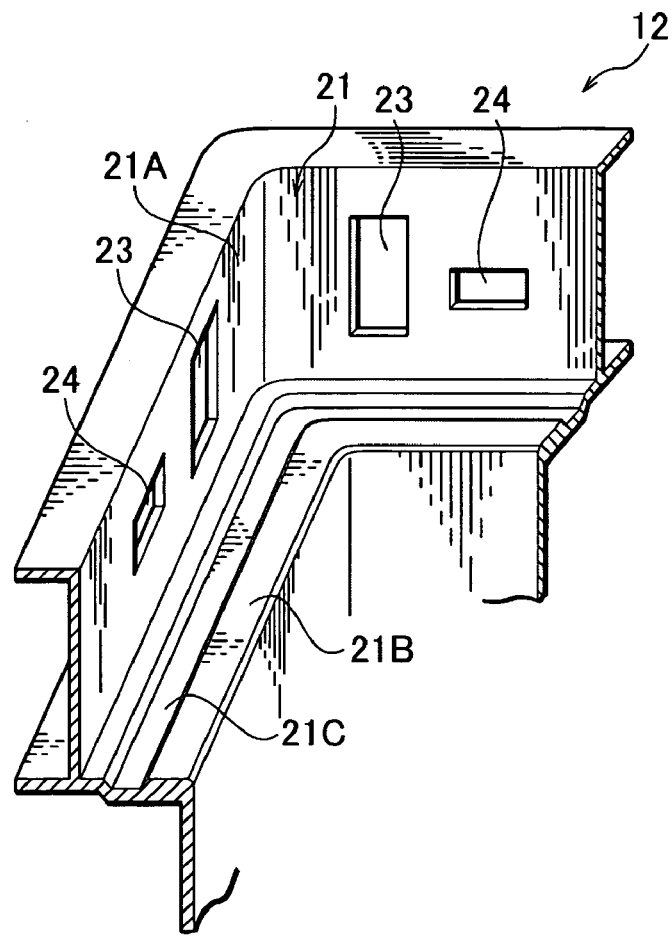
FIG. 5 is a partial perspective view showing a lid unit receiving member of the thin-plate supporting container according to the embodiment of the invention.
Figure 6:
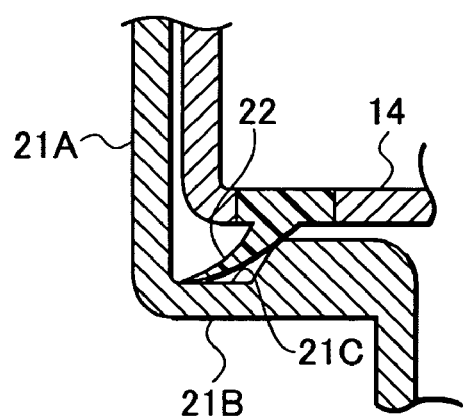
FIG. 6 is a partial cross-sectional view of the lid unit receiving member of the thin-plate supporting container according to the embodiment of the invention.

As shown in FIG. 5 and FIG. 6, the side walls 12A, 12B, 12C, 12D of the container body 12 are provided at the upper ends of the container body 12 with a lid unit receiving member 21 in which the lid unit 14 is fitted. The lid unit receiving member 21 is formed by widening the upper ends of the container body 12 to match the dimension of the lid unit 14. Thus, the lid unit 14 is adapted to be attached to the lid unit receiving member 21 by fitting in the inside of a vertical plate portion 21A of the lid unit receiving member 21, and by abutment against a horizontal plate portion 21B. Furthermore, the horizontal plate portion 21B is provided around the entire periphery thereof with a sealing groove 21C, and a gasket 22 attached to the lower surface of the first lid unit 14 is fitted in the sealing groove 21C to hermetically seal the thin-plate supporting container 11. The lid unit receiving member 21 has first receiving devices 23 located to receive lid unit locking claws (not shown) of a simplified attaching-and-detaching mechanism 26, which will be described later, and to fix the first lid unit 14 to the container body 12 at four corners of the inner surface of the vertical plate member 21A. Each of the first receiving devices 23 is formed by depressing the vertical plate member 21A into a square shape so that the lid unit locking claw fits in the inner upper surface of the first receiving device 23.

In addition, second receiving devices 24 are provided in the vicinity of the respective first receiving devices 23. The second fitting devices 24 fix the second lid unit 15 to the container body 12 by locking members 42 of a simplified attaching-and-detaching mechanism 32 of the second lid unit 15 fitted in the locking members 42.

Figure 7:
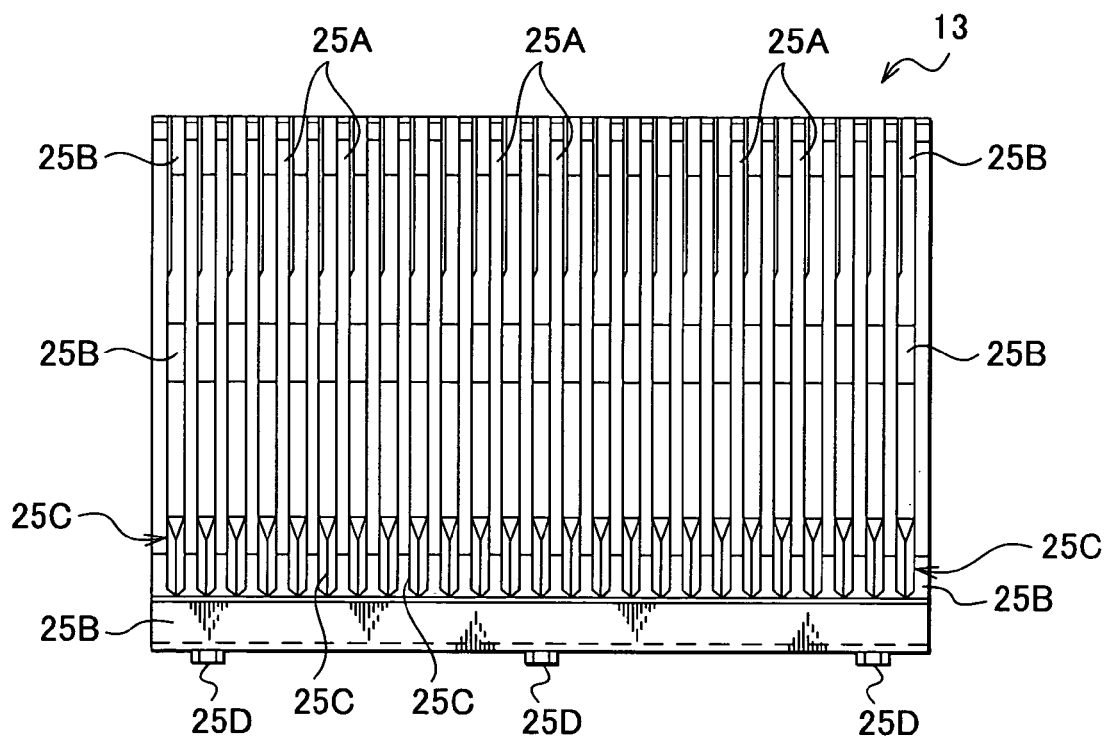
FIG. 7 is a front view showing a thin-plate supporting unit according to the embodiment of the invention.
Figure 8:
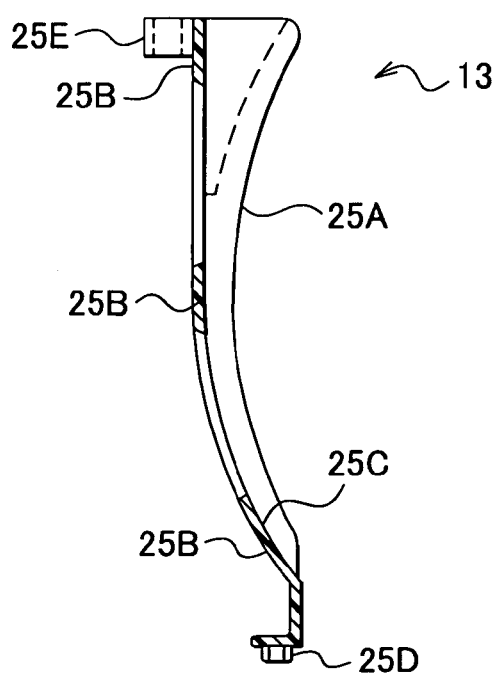
FIG. 8 is a side view showing the thin-plate supporting unit according to the embodiment of the invention.

The thin-plate supporting unit 13 is detachably attached to the container body 12 and has such a configuration as shown in FIG. 7 and FIG. 8. The thin-plate supporting unit 13 mainly includes a multiplicity of holding plate strips 25A disposed in parallel at regular intervals for individually holding the respective semiconductor wafers 49, connecting plate strips 25B for integrally supporting the respective holding plate strips 25A in the state of being disposed in parallel at regular intervals at three positions, and V-shaped grooves 25C formed on the inner side surface (the surface which abuts against the semiconductor wafer 49) of the innermost connecting plate strip 25B for supporting the semiconductor wafer 49. The surface or surfaces of the V-shaped groove 25C are rough-finished only the lower surface, or both the upper and lower surfaces of the V-shaped groove 25C are rough-finished, this V-shaped groove being located on the lower side in a state in which the container body 12 is oriented laterally (the state in which the semiconductor wafers 49 are placed horizontally). Rough-finishing of the V-shaped groove 25C on its surface means that the groove surface has formed thereon depressions and projections of about 10 to 15 μm at a density of about 20,000 to 30,000/cm$^2$. In the case where the surface of the V-shaped groove 25C is finished with too high a degree of precision, the semiconductor wafer 49 and the surface of the V-shaped groove 25C come into excessive intimate contact with each other. Consequently, the frictional resistance increases and impairs smooth sliding. In contrast, when the surface is finished with a sufficiently rough degree of precision, the semiconductor wafer 49 and the surface of the V-shaped groove 25C do not contact intimately with each other, reducing the frictional resistance. The surface of the V-shaped groove 25C should therefore be finished with such a roughness that gives projections and depressions of about 10 to 15 μm. Various means may be employed to roughen the surface of the V-shaped groove 25C. For example, the surface of the V-shaped groove 25C may be roughened by grinding or sand blasting, or may be formed using a metal mold in which the surface of a mold portion corresponding to the V-shaped groove 25C has been so roughened as to have depressions and projections of about 10 to 15 μm. Any means may be employed as long as the surface of the V-shaped groove 25C is finished with depressions and projections of about 10 to 15 μm at a density of about 20,000 to 30,000/cm$^2$.

On the back surface of the thin-plate supporting unit 13, lower supporting holes 25D are provided which fit in lower supporting projections (not shown) disposed inside the container body 12 and support the lower portion of the thin-plate supporting unit 13, and upper supporting holes 25E which fit in upper supporting projections (not shown) and support the upper portion of the thin-plate supporting unit 13.

The first lid unit 14 is formed in a dish-like shape and has a cylindrically swollen portion at the center thereof such that the central portion does not contact with the upper portions of the semiconductor wafers received in the container body 12. As shown in FIG. 3 and FIG. 4, the first lid unit 14 is provided at four corners thereof with simplified attaching-and-detaching mechanisms 26 for detachably fixing the first lid unit 14 to the container body 12. The simplified attaching-and-detaching mechanisms 26 mainly include lid unit locking claws (not shown) which project from the peripheral edge of the first lid unit 14. The lid unit locking claws are adapted to fit into the first receiving devices 23.

Figure 9:
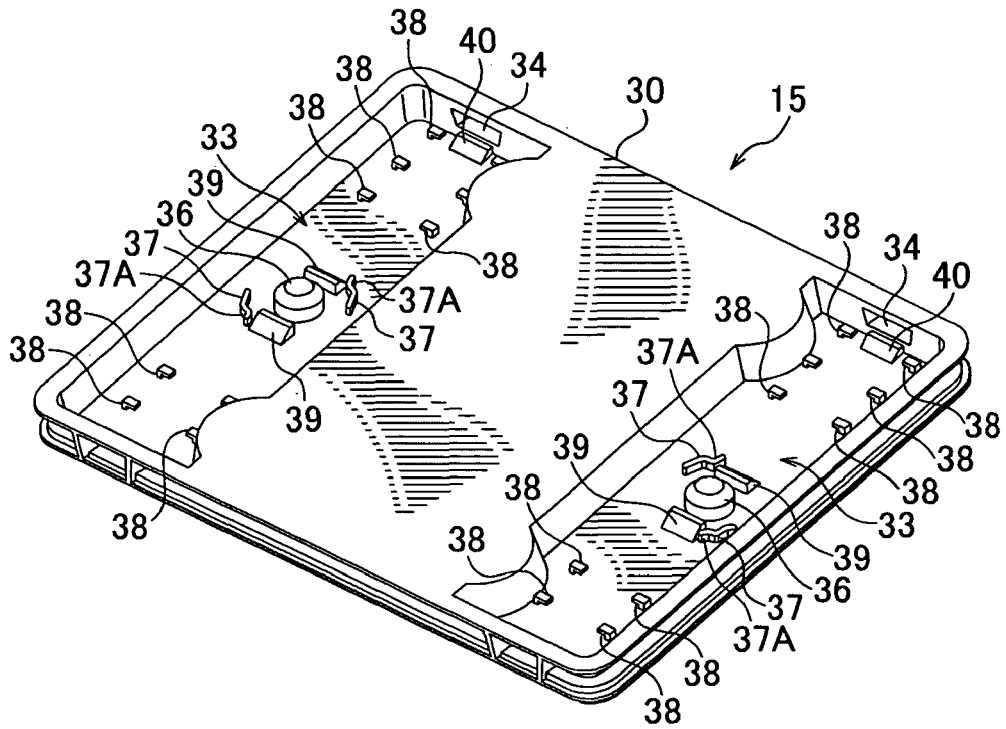
FIG. 9 is a perspective view showing an upper surface of a second lid unit according to the embodiment of the invention.
Figure 10:
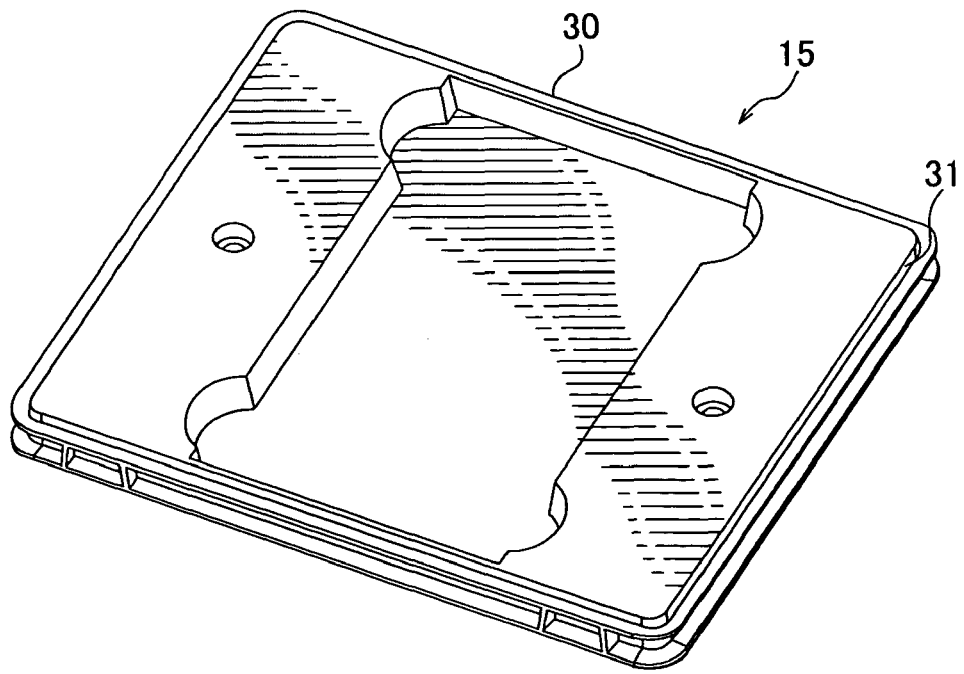
FIG. 10 is a perspective view showing a bottom surface of the second lid unit according to the embodiment of the invention.
Figure 11:
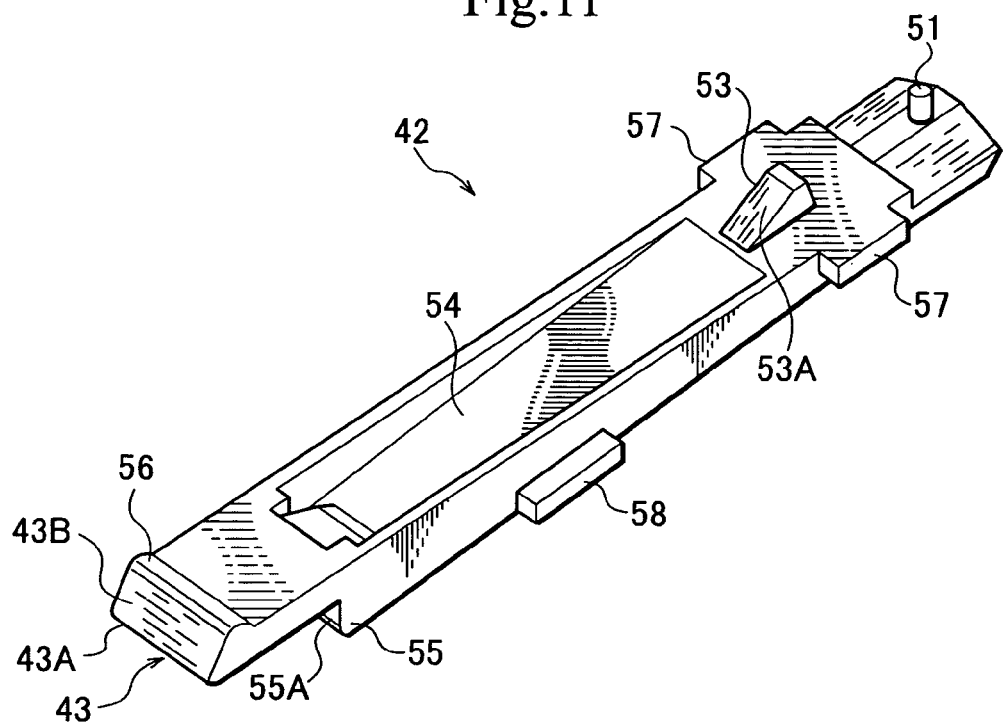
FIG. 11 is a perspective view showing an upper surface of a locking member according to the embodiment of the invention.
Figure 12:
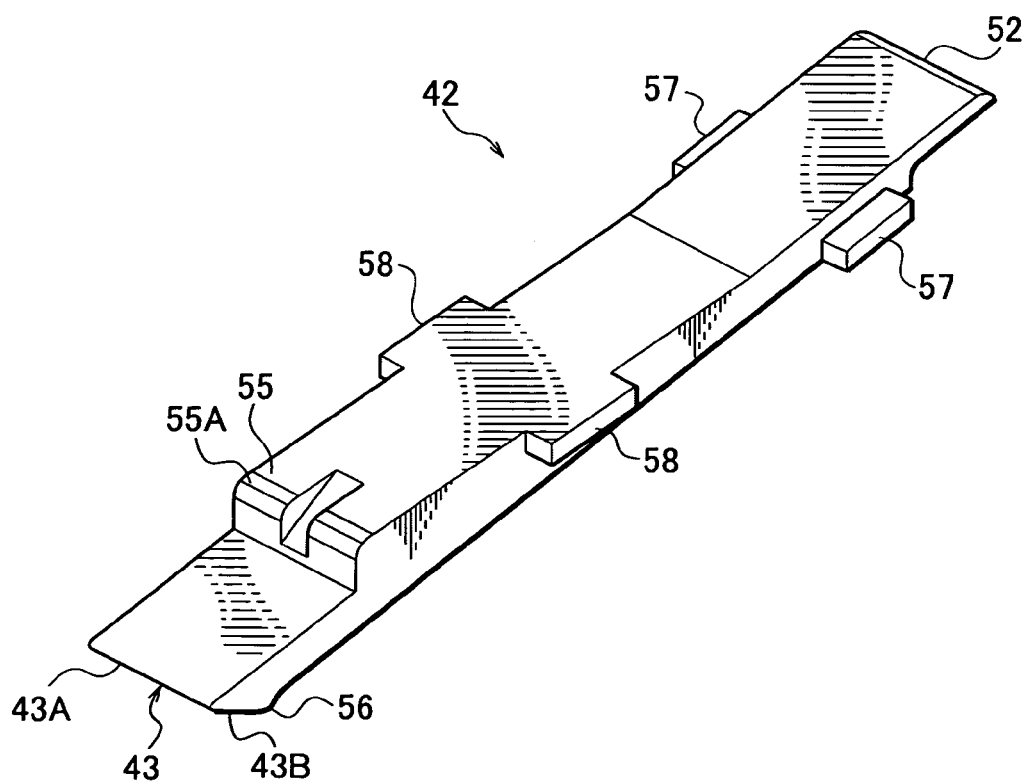
FIG. 12 is a perspective view showing a bottom surface of the locking member according to the embodiment of the invention.
Figure 13:
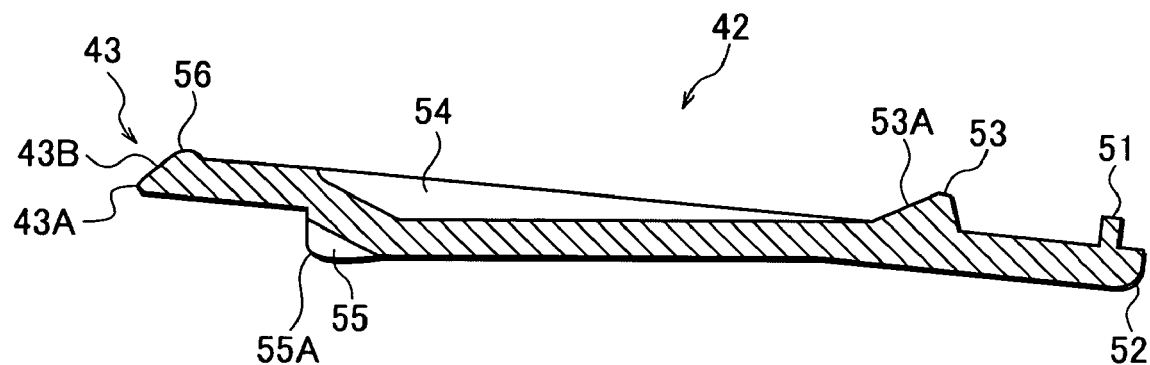
FIG. 13 is a cross-sectional side view showing the locking member according to the embodiment of the invention.
Figure 14:
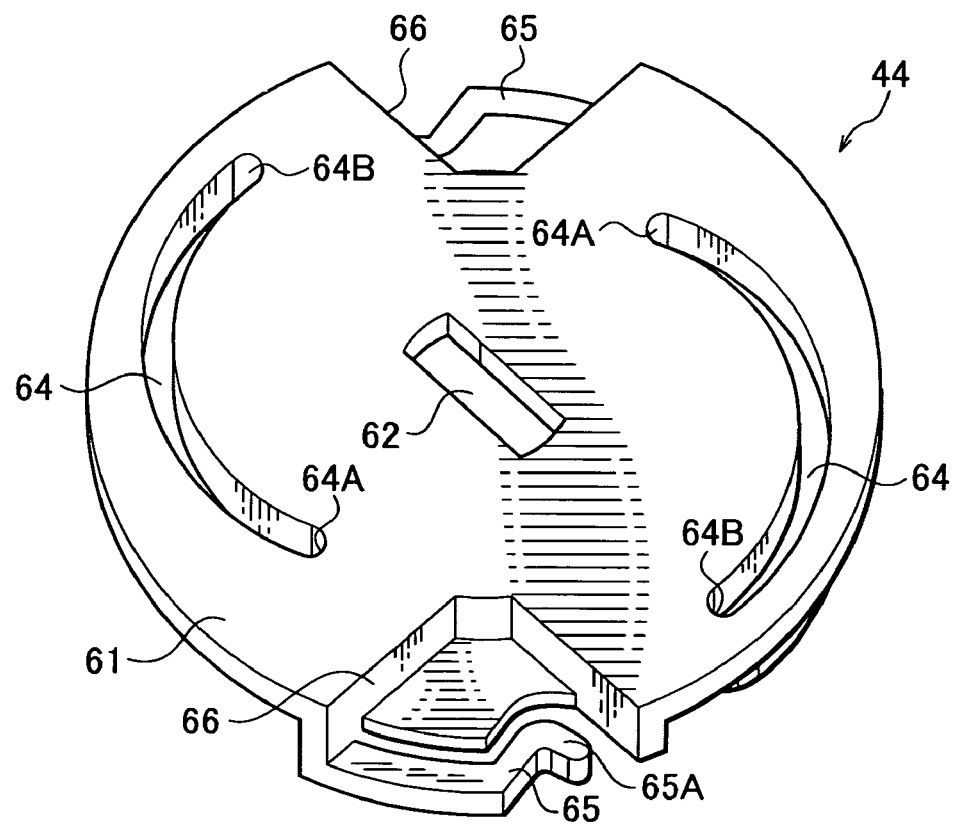
FIG. 14 is a perspective view showing an upper surface of a feed member according to the embodiment of the invention.
Figure 15:
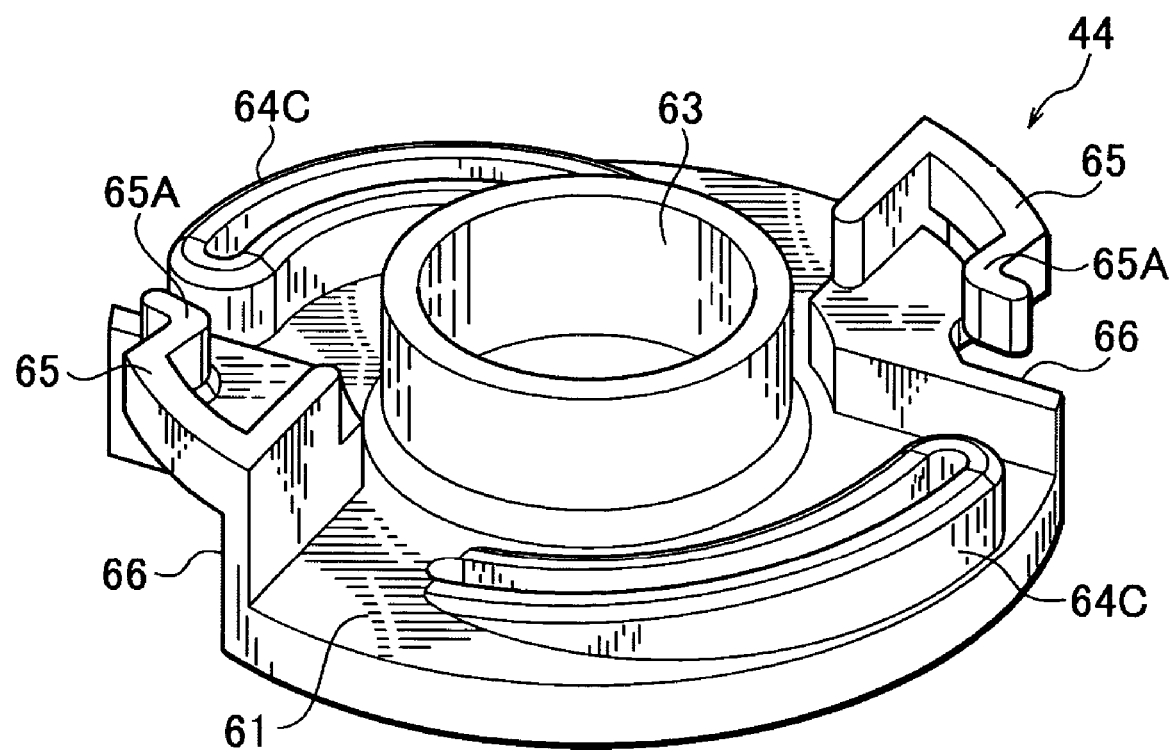
FIG. 15 is a perspective view showing a lower surface of the feed member according to the embodiment of the invention.
Figure 16:
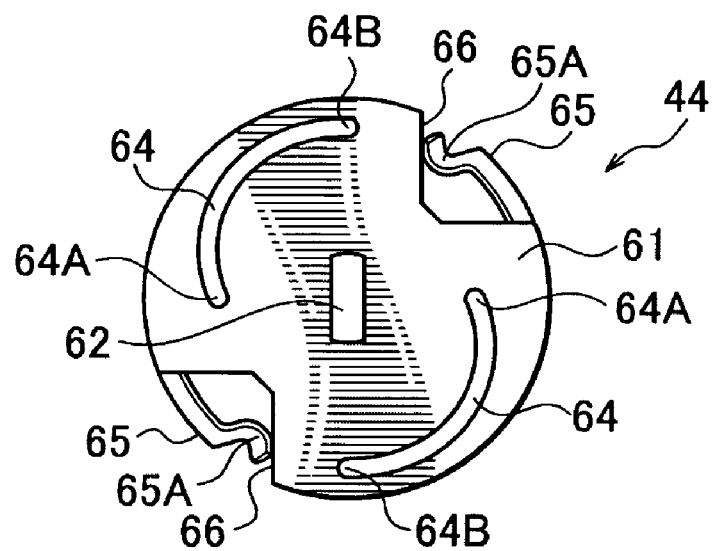
FIG. 16 is a plan view showing the feed member according to the embodiment of the invention.
Figure 17:
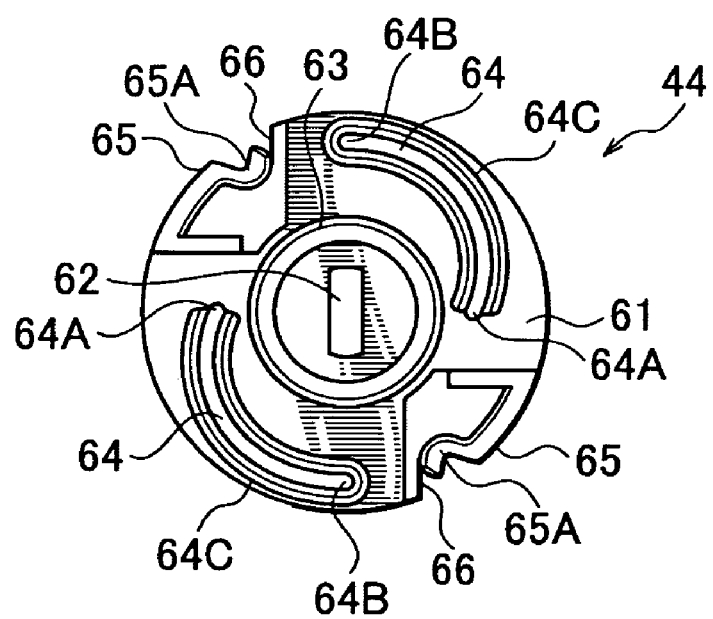
FIG. 17 is a back view showing the feed member according to the embodiment of the invention.

The second lid unit 15 is used for transportation of the thin-plate supporting container 11, or in a production line in a plant. The second lid unit 15 includes a main body 30, a cover plate (not shown), and simplified attaching-and-detaching mechanisms 32, as shown in FIG. 1, FIG. 9 and FIG. 10.

The main body 30 is formed to be small in thickness on the whole and generally square in shape and is configured so as not to project outwardly in a state of being attached to the lid body receiving member 21 of the container body 12. The main body 30 has gasket receiving devices 31 located on the periphery of the lower portion of the main body 30. The gasket receiving device 31 is provided with a gasket (not shown) and is adapted to seal the container body 12 by fitting into a sealing groove 21C in a state in which the main body 30 is mounted on the lid unit receiving member 21. The gasket may be formed in an appropriate shape corresponding to the shape of the sealing groove 21C as is in the gasket 22 on the first lid unit 14.

The main body 30 of the second lid unit 15 is provided at the shorter sides thereof (at both the upper left side and the lower right side in FIG. 9) with recesses 33 in which the simplified attaching-and-detaching mechanisms 32 fit. The recesses 33 are formed by depressing the ends of the main body 30 into a substantially rectangular shape. The shorter sides (both the upper right side and the lower left side in FIG. 9) of the recess 33 have openings 34 through which distal fitting portions 56 of the locking members 42, which will be described later, project and retract. The openings 34 are provided at the positions in alignment with the second receiving devices 24 of the lid unit receiving member 21 in a state in which the main body 30 fits in the lid unit receiving member 21. Each recess 33 includes at the bottom thereof a rotational movement supporting shaft 36, a stopper 37, locking claws 38, proximal lower cams 39, and distal cams 40. The recess 33 has a cover plate detachably attached thereto. The cover plate is demounted at the time of cleaning the simplified attaching-and-detaching mechanisms 32 located in the recess 33.

The rotational movement supporting shaft 36 is a member which rotationally supports a feed member 44 to be described later and protrudes cylindrically from the bottom thereof. The rotational movement supporting shaft 36 fits in a rotational cylinder 63 of the feed member 44, and supports the feed member 44 rotationally. The stopper 37 is a member which supports the feed member 44 in a state of being rotated at a predetermined angle. The stopper 37 is constituted of plate-like members standing upwardly from the bottom at two positions around the rotational movement supporting shaft 36. A receiving portion 37A is formed by bending the plate-like member. The feed member 44 is supported at a predetermined angle by fitting a projection 65A of an engaging strip 65 of the feed member 44 in the receiving portion 37A.

The locking claws 38 are members for fixing cover holding members 47, which will be described later, to the bottom of the recess 33. Since the cover holding members 47 are attached to both shorter sides of the recess 33 respectively, the locking claws 38 are also provided six on each shorter side of the recess 33 correspondingly. Each of the locking claws 38 is formed from an L-shaped member in which lower supporting plate strips 88 of the cover holding members 47 are fitted.

The proximal lower cams 39 and the distal cams 40 are members which constitute a cam mechanism 45 to be described later. The proximal lower cams 39 and a proximal upper cam 53, which will be described later, constitute a proximal cam for pushing the proximal side of the locking member 42 downwards when the locking member 42 is fed.

As shown in FIG. 1 and FIG. 9, the proximal lower cam 39 is a member for pressing (pressing downward) the proximal side of the locking member 42 toward the other side (downwardly in FIG. 1) as the locking member 42 is fed. The proximal lower cams 39 are disposed on both sides of the rotational movement supporting shaft 36, respectively. Each proximal lower cam 39 is formed in a substantially triangular shape in side cross section and is provided with a bevel 39A for moving the proximal side of the locking member 42 up and down. The surface of the bevel 39A is also rough-finished to reduce the frictional resistance with respect to a proximal sliding surface 52 of the locking member 42 in the same manner as described above.

The distal cam 40 is a member for pressing (lifting) the distal fitting portion 56 of the locking member 42 toward one side (upwardly in FIG. 1) as the locking member 42 is fed. The distal cam 40 is provided on both shorter sides of the recess 33 and face toward the openings 34. The distal cam 40 is formed in a triangular shape in side cross section, and is provided with a bevel 40A for lifting the distal side of the locking member 42 upward. The surface of the bevel 40A is also rough-finished to reduce the frictional resistance with respect to a distal sliding surface 55A of a fulcrum 55 of the locking member 42 in the same manner as described above. Provided at the upper end of the bevel 40A is a fitting recess 40B. The fitting recess 40B is a portion in which the fulcrum 55 of the locking member 42 fits.

The simplified attaching-and-detaching mechanisms 32 are provided in the recesses 33. The simplified attaching-and-detaching mechanism 32 is a device for allowing the second lid unit 15 to be easily attached to and detached from the container body 12. Each simplified attaching-and-detaching mechanism 32 includes, as shown in FIG. 1, the locking member 42, a guiding member 43, the feed members 44, the cam mechanism 45, a holding cover 46, and the cover holding members 47.

The locking member 42 is a member which extends from the opening 34 of the main body 30 in a state in which the second lid unit 15 is mounted on the lid unit receiving member 21 of the container body 12 and fits in the second receiving device 24 of the lid unit receiving member 21. The locking member 42 includes, as shown in FIG. 1, FIGS. 11 to 13, a connecting shaft 51, the proximal sliding surface 52, the proximal upper cam 53, an upper groove 54, the fulcrum 55, the distal fitting portion 56, a proximal plate portion 57 and a distal side plate portion 58.

The connecting shaft 51 is a member for connecting the feed member 44 and the locking member 42 with each other by fitting in an elongated hole portion 64 of the feed member 44 to be described later. The connecting shaft 51 is formed in a round rod shape and is disposed upwardly at the proximal portion of the locking member 42.

The proximal sliding surface 52 is a portion which contacts slidably with the bevel 39A of the proximal lower cam 39 for allowing the proximal portion of the locking member 42 to move up and down. The proximal sliding surface 52 is formed by obliquely grinding the lower side of the proximal portion of the locking member 42. To reduce the frictional resistance between the proximal lower cam 39 and the bevel 39A, the surface of the proximal sliding surface 52 is rough-finished in the same manner as described above. When the locking member 42 is fed in a state in which the proximal sliding surface 52 contacts slidably with the bevel 39A of the proximal lower cam 39, the proximal portion of the locking member 42 is pressed downwardly, followed by dragging of the locking member 42, so that the proximal portion of the locking member 42 is pressed upwardly.

The proximal upper cam 53 is a member that allows the proximal portion of the locking member 42 to move up and down together with the proximal lower cam 39. The proximal upper cam 53 is a portion which corresponds to a power point according to the principle of leverage. The connecting shaft 51 does not work as the power point of the principle of leverage, but merely undergoes a force in the longitudinal direction when the locking member 42 projects or retracts.

The proximal upper cam 53 is provided in the vicinity of the proximal portion of the locking member 42 so as to be directed upwardly. The proximal upper cam 53 is formed in a triangular shape as viewed sideways in cross section and has a bevel 53A provided to allow the proximal side of the locking member 42 to vertically reciprocate. The surface of the bevel 53A of the proximal upper cam 53 is rough-finished as is in the bevel 39A of the proximal lower cam 39 and contacts slidably with a cam holding projection 69 to be described later on the holding cover 46. The surface of the projection 69 is also rough-finished. The bevel 53A of the proximal upper cam 53 is set to extend substantially in parallel with the bevel 39A of the proximal lower cam 39. Accordingly, the proximal portion of the locking member 42 is pressed downwardly by the proximal upper cam 53 caused to be pressed by the cam holding projection 69 when the locking member 42 is fed in a state in which the cam holding projection 69 and the bevel 53A of the proximal upper cam 53 contact slidably with each other. Also, when the locking member 42 is dragged, the proximal sliding surface 52 is pressed by the bevel 39A of the proximal lower cam 39 so that the proximal portion of the locking member 42 is pressed upwardly.

The fulcrum 55 is a portion which supports the distal end of the locking member 42 and works as a center of rotation. The fulcrum 55 corresponds to a fulcrum according to the principle of leverage. The fulcrum 55 is formed below a portion near the extremity of the locking member 42 and in a squarish shape standing approximately at right angle. At the apex of the squarish fulcrum 55, the distal sliding surface 55A is formed. The distal sliding surface 55A is a portion which comes into sliding contact with the bevel 40A of the distal cam 40 to vertically reciprocate the distal fitting portion 56 of the locking member 42. The distal sliding surface 55A is provided by obliquely grinding the apex of the fulcrum 55 and is rough-finished to reduce the frictional resistance with respect to the bevel 40A of the distal cam 40 in the same manner as described above. When the locking member 42 is fed in a state in which the distal sliding surface 55A contacts slidably with the bevel 40A of the distal cam 40, the distal fitting portion 56 of the locking member 42 moves upwardly, thereby dragging the locking member 42, followed by downward movement of the extremity of the locking member 42.

Further, the fulcrum 55 fits into the fitting recess 40B of the distal cam 40 and rotates about the fitting recess 40B.

The distal fitting portion 56 is a portion which extends outwardly from the opening 34 of the recess 33 and fits directly into the second receiving device 24 of the lid unit receiving member 21. The distal fitting portion 56 is a working point of the principle of leverage. The distal fitting portion 56 is provided at a slight distance from the fulcrum 55 so that a sufficient force can be generated in a state of being fitted in the second receiving device 24 of the lid unit receiving member 21.

The proximal plate portion 57 and the distal plate portion 58 are members that support the locking member 42 for reciprocal movement. The surfaces of the proximal plate portion 57 and of the distal plate portion 58 are also rough-finished in the same manner as described above. Moreover, all the sliding surfaces of the respective portions that must slide through the projecting and retracting operation of the locking member 42, and the connecting shaft 51, the rotational movement supporting shaft 36, the rotational cylinder 63, the feed member 44, and the elongated hole 64 of the feed member 44 are rough-finished in the same manner as described above.

The guiding member 43 is a member that initially enters the second receiving device 24 and then guides the locking member 42 into the second receiving device 24. The guiding member 43 is located at the extremity of the distal fitting portion 56 of the locking member 42. The guiding member 43 includes a reaching portion (distal end) 43A at the tip of a guiding portion 43B The reaching portion 43A is a member that firstly reaches the second receiving device 24. That is, the reaching portion 43A firstly reaches the second receiving device 24 when the locking member 42 extends toward the second receiving device 24 in a state in which the main body 30 lightly fits in the lid unit receiving member 21 of the container body 12. The reaching portion 43A reaches the second receiving device 24 when the locking member 42 extends toward the second receiving device 24 in a state in which the main body 30 lightly fits in the lid unit receiving member 21 of the container body 12, and the gasket 22 contacts lightly with the sealing groove 21C without forcible pressing. The reaching portion 43A has a projection provided at the extremity of the locking member 42 and shifted inwardly of the container body 12 (the position shifted downwardly in FIG. 1).

The guiding portion 43B is a member that guides the locking member 42 toward the second receiving device 24. The guiding portion 43B is formed from a bevel provided to connect the reaching portion 43A and the distal fitting portion 56 of the locking member 42. The guiding portion 43B reaches the second receiving device 24 at the reaching portion 43A and then undergoes inward pressing while the bevel contacts slidably with the edge of the second receiving device 24 as the locking member 42 extends for guiding into the second receiving device 24. The surface of the bevel, which constitutes the guiding portion 43B, is rough-finished in the same manner as described above.

The feed member 44 is a member that connects to the locking member 42 and allows the locking member 42 to project and retract. The feed member 44 is rotationally attached to the rotational movement supporting shaft 36 of the recess 33 and includes a top plate 61, a key groove 62, the rotational cylinder 63, the elongated holes 64, and the engaging strips 65 as shown in FIG. 1 and FIGS. 14 to 17.

The top plate 61 is formed substantially in a disk-like shape. At two opposed positions on the top plate 61, notches 66 are formed to provide the engaging strips 65.

The key groove 62 is a groove in which the latch key of the lid unit attaching-and-detaching device (not shown) fits when that device attaches or detaches the second lid unit 15 automatically. The key groove 62 is provided at the center on the upper surface of the top plate 61.

The rotational cylinder 63 is a member that rotationally attaches the feed member 44 to the rotational movement supporting shaft 36 of the recess 33. The rotational cylinder 63 is provided at the center on the lower side of the top plate 61. The key groove 62 is formed at the center of the rotational cylinder 63.

The elongated holes 64 are holes that convert rotating movement of the feed member 44 into projecting and retracting movements of the locking member 42. The elongated holes 64 are provided, respectively, at two opposed positions on the top plate 61. The elongated holes 64 are formed in a partially spiral shape so that one end 64A is close to the center of the top plate 61, and the other end 64B is apart from that center. When the connecting shaft 51 of the locking member 42 fits in the one end 64A of the elongated hole 64, the locking member 42 retracts, and when it fits in the other end 64B, the locking member 42 is fed.

On the lower side of the top plate 61 at the elongated holes 64, gently inclined wall surfaces 64C are provided. The wall surface 64C has the same level as the lower surface of the top plate 61 at the one end 64A of the elongated hole 64 and increases in height gradually toward the other end 64B. This ensures connection between the locking member 42 and the feed member 44. In other words, since the proximal portion of the locking member 42 is pressed downward in a state in which the connecting shaft 51 of the locking member 42 fits in the elongated hole 64 at the other end 64B, the connecting shaft 51 can reliably fit into the elongated hole 64 even in a state in which the proximal portion is pressed downwardly.

The engaging strip 65 is a member that supports the feed member 44 in a state in which the feed member 44 rotates by a predetermined angle. The engaging strip 65 is provided at each of two opposed positions of the extremities of the top plate 61. The engaging strip 65 is formed of a plate-like member extending from the top plate 61 along the peripheral edge. The extremity of the engaging strip 65 is provided with a projection 65A to be fitted into the receiving portion 37A of the stopper 37. In addition, the engaging strip 65 is of a resilient character and is capable of supporting the projection 65A resiliently. When the projection 65A fits into the receiving portion 37A of the stopper 37, the feed member 44 is supported at the position where it is rotated by a predetermined angle (an angle at which the locking member 42 is extended, and the second lid unit 15 is fixed to the container body 12).

The cam mechanism 45 is a member that abuts against the upper surface of the second receiving device 24, and presses the second lid unit 15 downwardly toward the container body 12 and fixes the same in a state in which the distal fitting portion 56 of the locking member 42 having been fed by the feed member 44 fits into the second receiving device 24 of the lid unit receiving member 21. With the cam mechanism 45, the distal fitting portion 56 of the locking member 42 fed by the feed member 44 is pressed downwardly and brought into abutment with the upper surface of the second receiving device 24, and at the same time, the proximal portion is pressed downwardly. Hence, the second lid unit 15 is pressed downwardly toward the container body 12 according to the principle of leverage and then fixed. The cam mechanism 45 includes the proximal lower cams 39, the proximal upper cam 53, the proximal sliding surface 52, the cam holding projection 69, the distal cams 40 and the distal sliding surfaces 55A. The proximal lower cam 39, the proximal upper cam 53, the proximal sliding surface 52, the distal cam 40 and the distal sliding surface 55A are as described above.

The cam holding projection 69 is a member that abuts against the bevel 53A of the proximal upper cam 53 to press the proximal portion of the locking member 42 downwardly as the locking member 42 is fed. The cam holding projection 69 is provided on the lower surface of the holding cover 46. More specifically, the cam holding projection 69 is provided at the position where the cam holding projection 69 and the bevel 53A of the proximal upper cam 53 contact slidably with each other without any gap left therebetween in a state in which the proximal sliding surface 52 of the locking member 42 come into sliding contact with the bevel 39A of the proximal lower cam 39.

Figure 18:
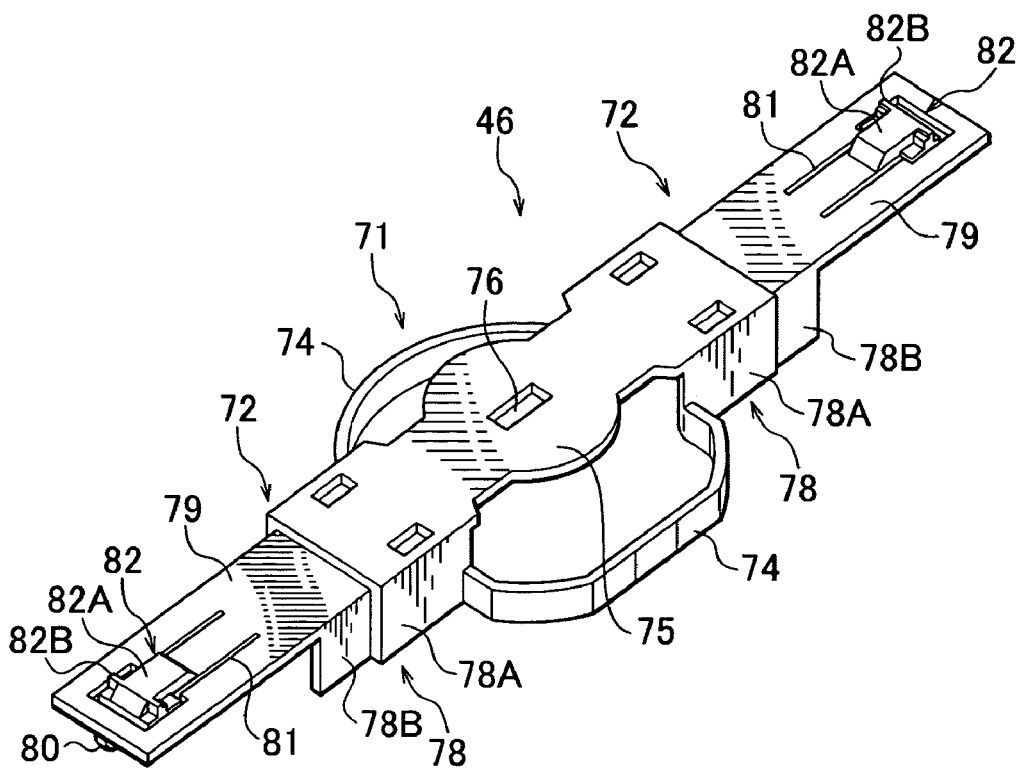
FIG. 18 is a perspective view showing an upper surface of a holding cover according to the embodiment of the invention.
Figure 19:
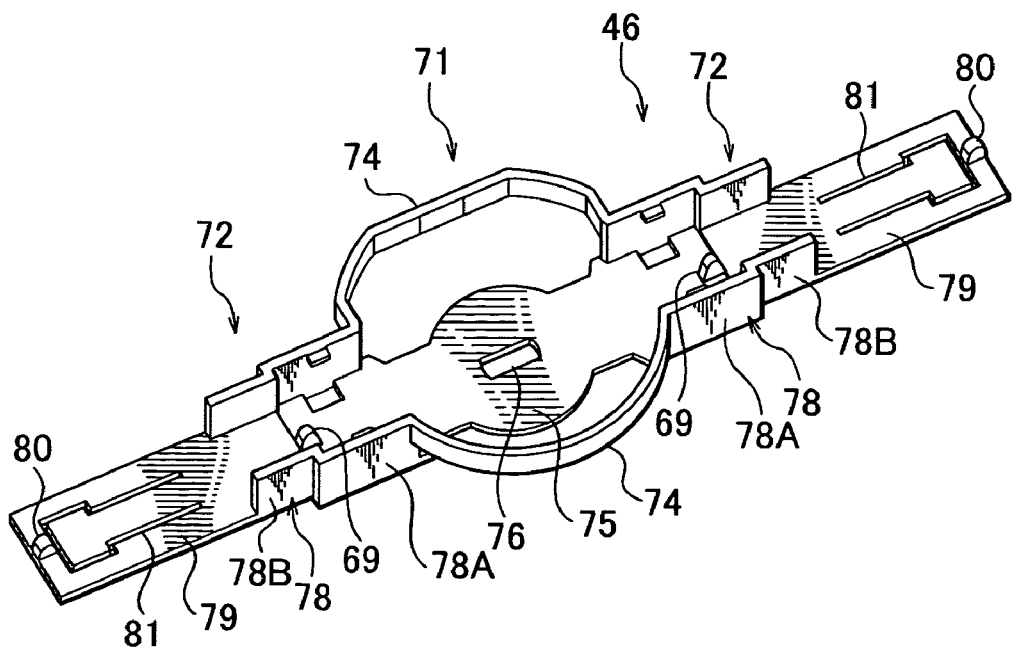
FIG. 19 is a perspective view showing a lower surface of the holding cover according to the embodiment of the invention.

The holding cover 46 is a member that holds the locking member 42 and the feed member 44. The holding cover 46 includes a feed member holding portion 71 and locking member holding portions 72, as shown in FIGS. 18 and 19.

The feed member holding portion 71 is a member that holds the feed member 44 in a state in which the feed member 44 rotates. The feed member holding portion 71 includes a peripheral plate 74 and a top plate 75. The peripheral plate 74 is adapted to cover the periphery of the feed member 44. The top plate 75 is adapted to cover the upper side of the feed member 44 and is provided at the center thereof with a key hole 76 of the same size as the key groove 62 on the feed member 44. The key hole 76 is in alignment with the key groove 62 of the feed member 44 in a state in which the top plate 75 covers the feed member 44. Thus, the key grove 62 and the key hole 76 are brought into alignment with each other in a state in which the locking member 42 retracts.

The locking member holding portion 72 is a member that supports the locking member 42 in a state in which the latter moves reciprocally. The locking member holding portion 72 is provided, respectively, on the left and right sides of the feeding member holding portion 71. The locking member holding portion 72 includes side plates 78 and top plates 79.

The side plates 78 are members that support a portion around the proximal portion of the locking member 42 from the left and right sides. Each side plate 78 includes a wide portion 78A and a narrow portion 78B. The wide portion 78A is a portion in which to fit the proximal plate portion 57 of the locking member 42. The narrow portion 78B is a portion in which to fit a portion between the proximal plate portion 57 and the distal plate portion 58 of the locking member 42.

Each top plate 79 is a member that supports the locking member 42 from the upper side. The top plate 79 is provided with the above-described cam holding projection 69 at the proximal portion on the lower surface. The top plate 79 is provided at the extremity of the lower surface thereof with a supporting projection 80 to be fitted in the upper groove 54 of the locking member 42. The top plate 79 has a slit 81 provided on the distal side, and the slit 81 has a protruded portion 82 located at the extremity thereof. The protruded portion 82 includes a central protruded strip 82A and a lateral locking strip 82B, and is resiliently supported in the slit 81. When the central protruded strip 82A and the lateral locking strip 82B of the protruded portion 82 engage with a criss-cross notch 86A of the cover holding member 47, the holding cover 46 is positioned with respect to the cover holding member 47.

Figure 20:
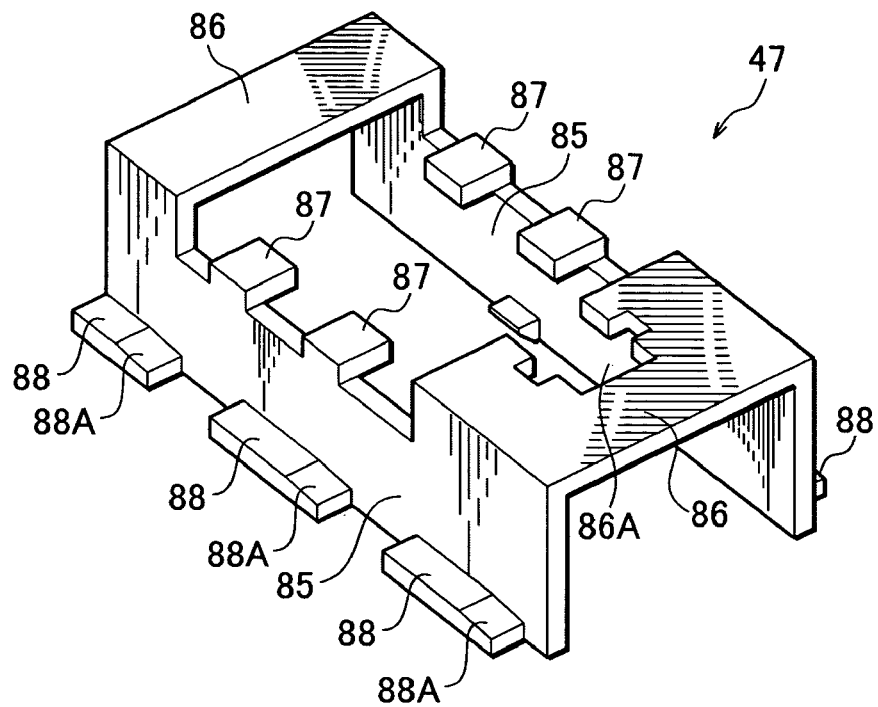
FIG. 20 is a perspective view showing an upper surface of a cover holding member according to the embodiment of the invention.
Figure 21:
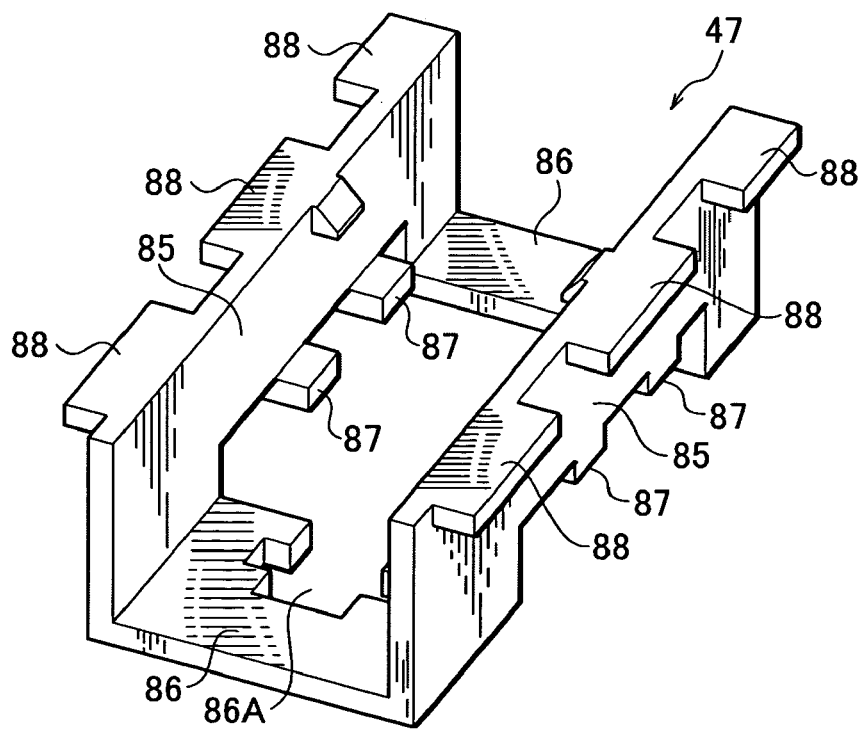
FIG. 21 is a perspective view showing a lower surface of the cover holding member according to the embodiment of the invention.
Figure 22:
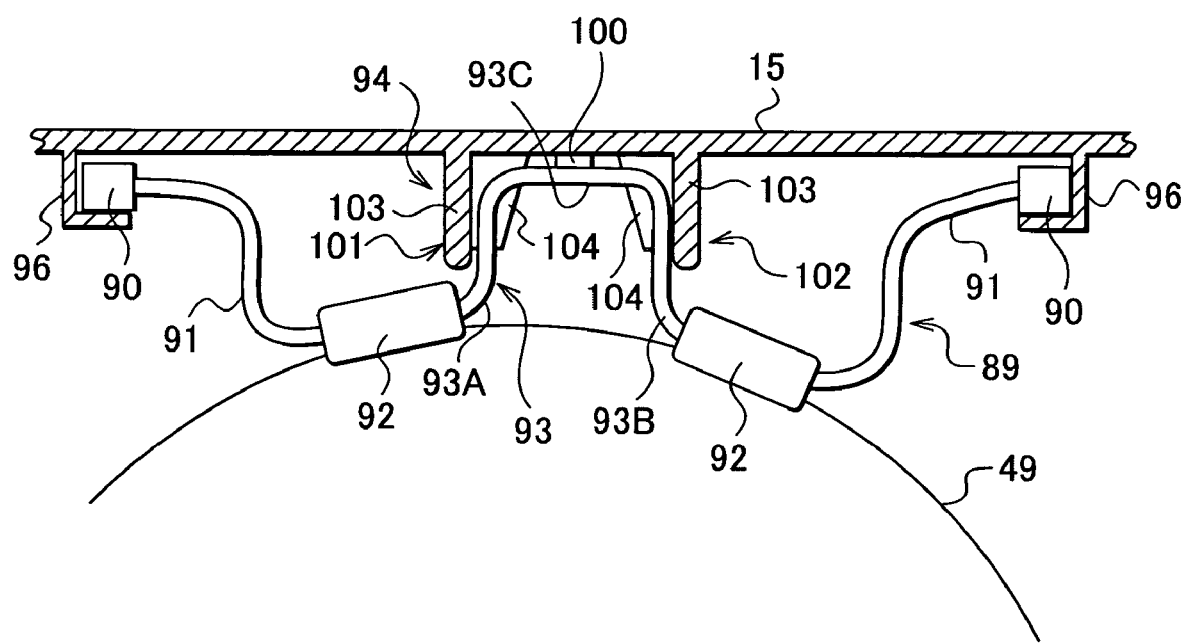
FIG. 22 is a cross-sectional side view showing a wafer holding unit according to the embodiment of the invention.
Figure 23:
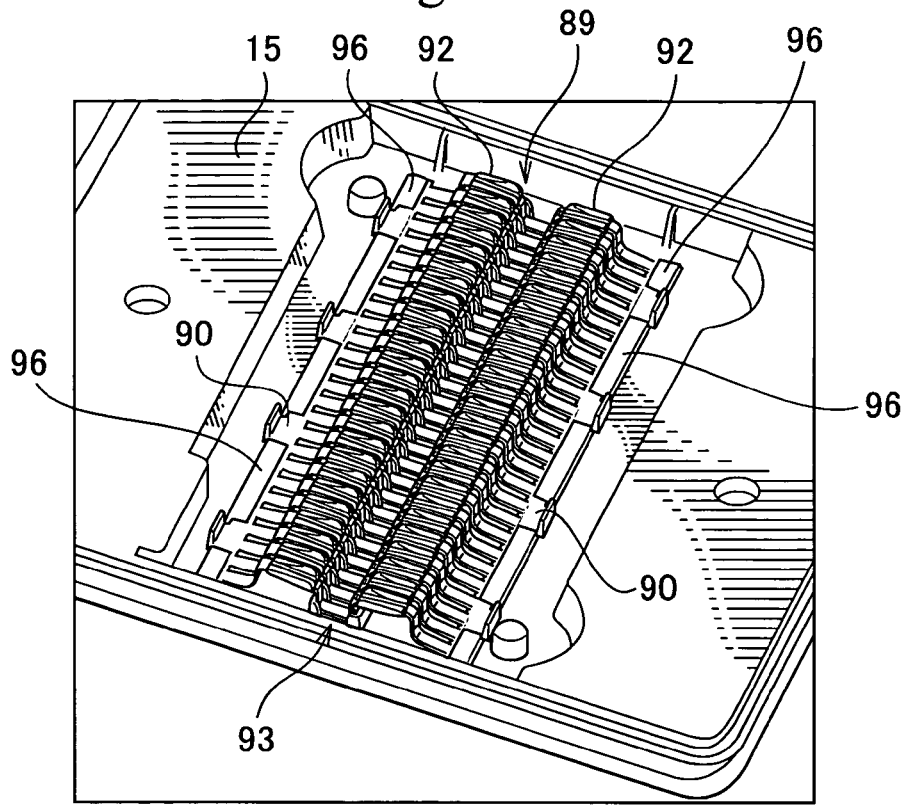
FIG. 23 is a perspective view showing the wafer holding unit according to the embodiment of the invention.
Figure 24:
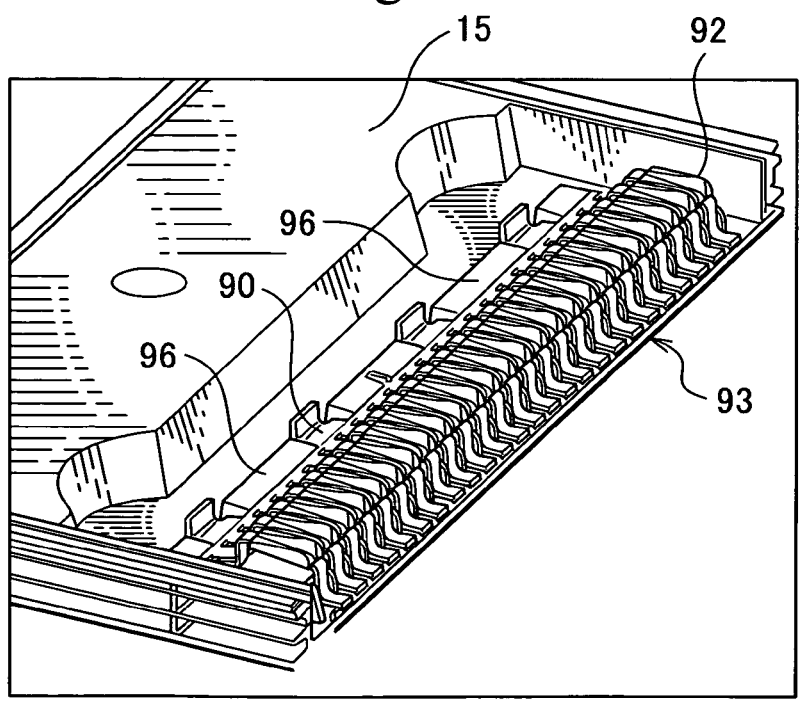
FIG. 24 is a cross-sectional perspective view showing the wafer holding unit according to the embodiment of the invention.
Figure 25:
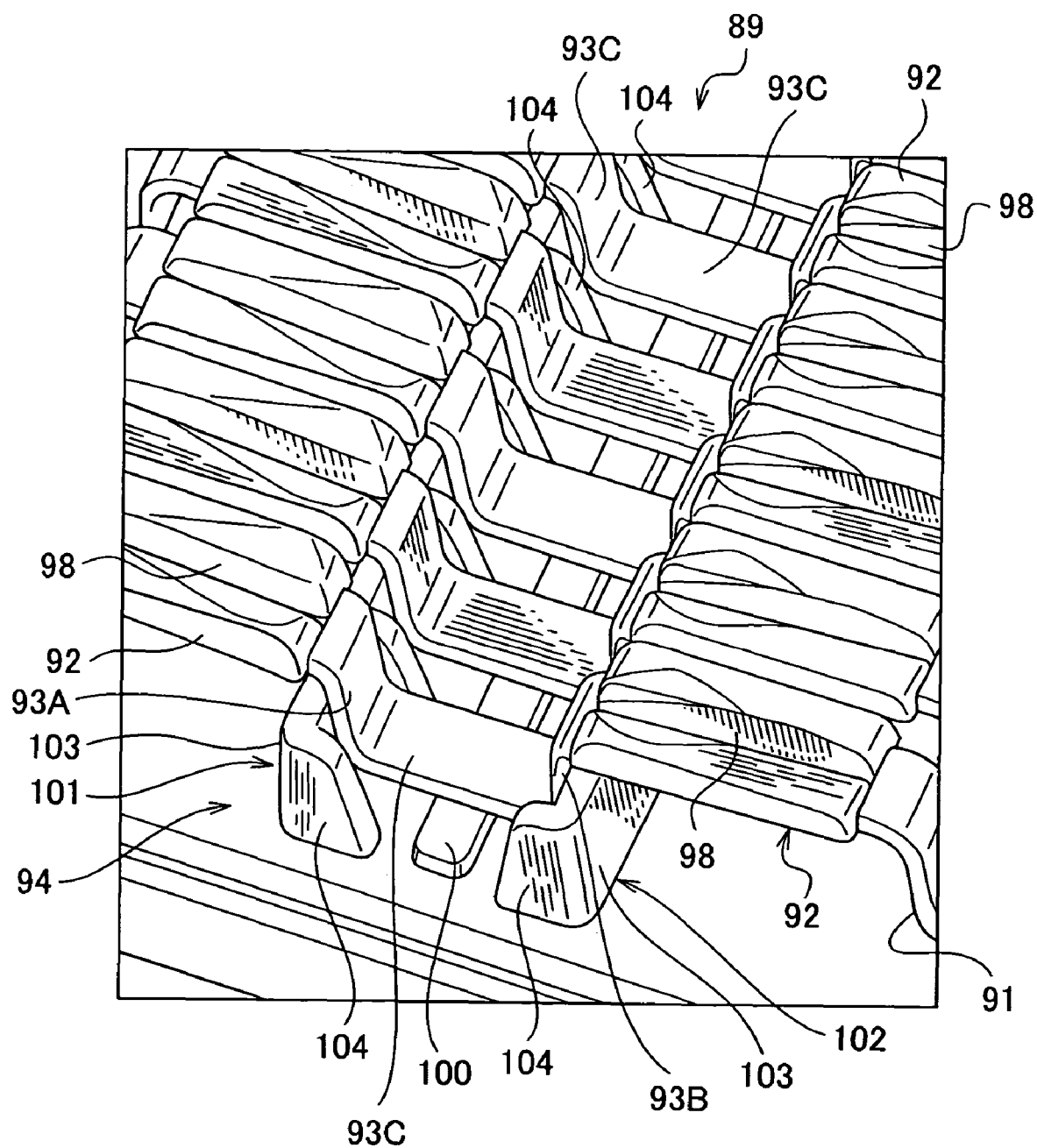
FIG. 25 is a perspective view showing important portions of the wafer holding unit according to the embodiment of the invention.

As shown in FIGS. 1, 20 and 21, the cover holding member 47 is a member that fixes the holding cover 46 to the recess 33 of the second lid unit 15. More specifically, the cover holding member 47 supports the locking member holding portion 72 to fix the holding cover 46 to the recess 33. The cover holding member 47 includes side plates 85, top plates 86, upper supporting strips 87 and lower supporting strips 88.

The respective side plates 85 cover the left and right sides of the locking member 42 to reciprocate the latter. The top plates 86 integrally support the respective side plates 85 and cover the upper side of the locking member 42 to reciprocally move the latter. The upper supporting strips 87 are members that support the top plate 79 of the locking member holding portion 72 of the holding cover 46 from the lower side. The top plate 79 of the locking member holding portion 72 is supported from above and below by the top plate 86 and the upper supporting strips 87 of the cover holding member 47.

The lower supporting strips 88 are portions that fix the cover holding member 47 to the recess 33. Three of the lower supporting strips 88 are provided at each of the lower ends of the respective side plates 85. When the respective lower supporting strips 88 fit into the locking claws 38 provided in the recess 33, the cover holding member 47 is fixed to the recess 33. The respective lower side supporting strips 88 have tapered portions 88A formed to facilitate fitting of the locking claws 38.

The first lid unit 14 and the second lid unit 15 are provided on their respective lower surfaces with wafer holding units 89 as thin-plate holding members, as shown in FIGS. 22 to 26. The wafer holding units 89 are members that support a multiplicity of semiconductor wafers 49 received from above in the container body 12. Each wafer holding unit 89 includes proximal end supporting portions 90, resilient supporting plate portions 91, contact strips 92, a supporting plate connecting member 93 and a supporting rib 94.

The proximal end supporting portions 90 are members provided at both ends of the wafer holding unit 89, respectively, to directly support the two resilient supporting plate portions 91. Each proximal end supporting portion 90 is formed in a square rod shape and extends along the entire longitudinal length (in the vertical direction in FIG. 23) of the wafer holding unit 89. The lid unit 15 is provided on its lower surface with two hook-shaped supporting members 96. The proximal end supporting portion 90 is fitted into the respective hook-shaped supporting portions 96 and is fixed to the back surface of the lid unit.

Each resilient supporting plate portion 91 is a member that resiliently supports the outer ends of each contact strip 92. Two of the resilient supporting plate portions 91 are aligned by the number corresponding to the number of the semiconductor wafers 49 to be received in the container body 12. The resilient supporting plate portions 91 are lined laterally and fixed to the proximal end supporting portion 90. The resilient supporting plate portion 91 is formed by being bent into an S-shape as viewed sideways. The two resilient supporting plate portions 91 are fixed at their proximal portions to the two proximal end supporting portions 90, respectively, and are provided with the contact strips 92 so that the latter are resiliently supported.

Figure 26:
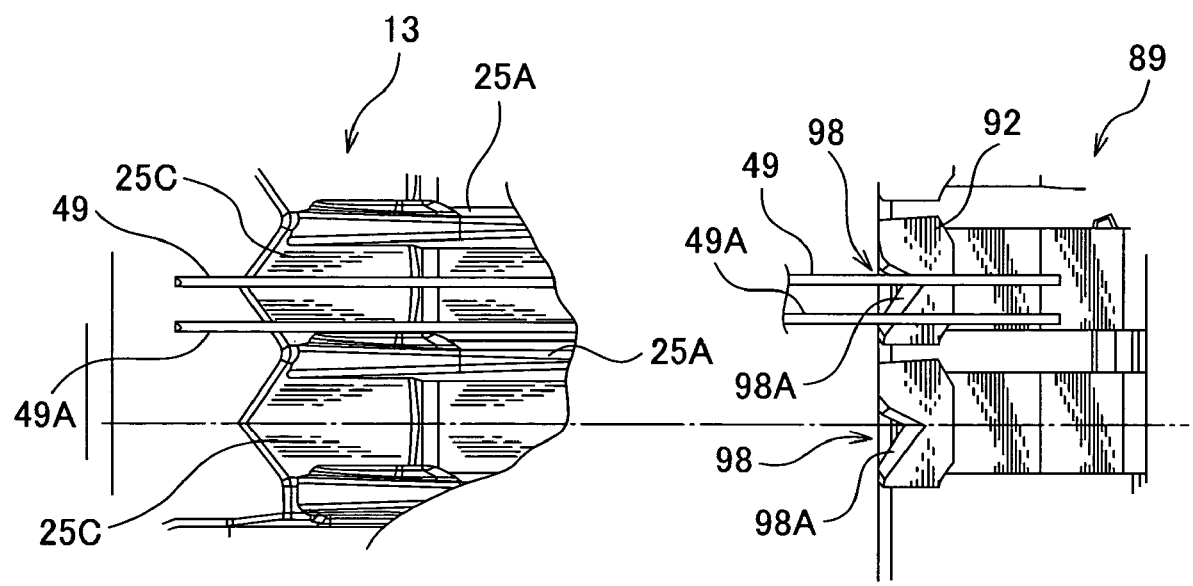
FIG. 26 is an enlarged view showing important portions of the thin-plate supporting unit and the wafer holding unit according to the embodiment of the invention.

Each contact strip 92 is a member that contacts directly with the peripheral portion of each semiconductor wafer 49, thereby supporting each semiconductor wafer 49 directly on one surface of the contact strip 92, a V-shaped groove 98 is provided in which the semiconductor wafer 49 fits as shown in FIG. 26. The V-shaped groove 98 supports the semiconductor wafer 49 from the side of the lid unit 15 by allowing the peripheral portion of the semiconductor wafer 49 to fit into the groove bottom. A lower surface 98A of the V-shaped groove 98 is made large in area, the lower surface 98A being provided as constituting a lower side in a state in which the semiconductor wafers 49 are oriented horizontally (in a state in which the container body 12 is placed laterally). Namely, the angle of inclination is made small to increase the area of the lower surface 98A. Hence, the lower end of the lower surface 98A is extended downwardly and is set to position below the semiconductor wafer 49 having been shifted downwardly. The state in which the semiconductor wafer 49 shifts downwardly denotes the state in which when the container body 12 is oriented laterally, the respective semiconductor wafers 49 are displaced from the V-shaped groove 25C of the thin-plate supporting portion 13 and are placed on the plate holding strips 25A (the state of the semiconductor wafers 49A in FIG. 26). Furthermore, the lower surface 98A is rough-finished as is the case with the surface of the V-shape groove 25C. Although the area of the lower surface 98A is increased in this embodiment, the V-shaped groove 98 may be shifted downwardly.

The supporting plate connecting member 93 is a member that connects the two contact strips 92 with each other and supports these contact strips. Both ends of the supporting plate connecting member 93 are connected to the contact strips 92 so as to support the same resiliently. The supporting plate connecting member 93 is generally U-shaped as viewed sideways in cross section. That is, it includes vertical plate portions 93A, 93B located opposite to each other, and a lateral plate portion 93C extending therebetween. The vertical plate portions 93A, 93B are disposed on the back surface of the lid unit 15 and can hardly be deflected to support the respective contact strips 92.

The lateral plate portion 93C is resiliently deflectable. The lateral plate portion 93C takes charge of most of the functions performed by the supporting plate connecting member 93 in supporting the respective contact strip 92 resiliently. The lateral plate portion 93C is disposed to extend along the back surface of the lid unit 15 in a state in which the vertical plate portions 93A, 93B are connected, respectively, to both ends of the lateral plate portion 93C. The lateral plate portion 93C is supported at its central portion by a supporting ridge 100 to be described later, so that both ends of the lateral plate portion 93C are deflectable by utilizing the supporting ridge 100 as a point of support.

The supporting rib 94 is a supporting member that supports the supporting plate connecting member 93, thereby preventing the same from becoming shifted in the direction along the back surface of the lid unit. The supporting rib 94 is provided at the center of the back surface of the lid unit 15. The supporting rib 94 entirely covers a multiplicity of supporting plate connecting members 93 of the wafer holding unit 89. More specifically, the supporting rib 94 has a length that can fit to all the supporting plate connecting members 93 lined up by the number corresponding to the number of the semiconductor wafers 49 to be received therein. The supporting rib 94 includes two supporting walls 101, 102.

The supporting walls 101, 102 are disposed opposite to each other. Each of the supporting walls 101, 102 includes a supporting plate 103 and a partitioning plate 104.

The supporting plate 103 is a member that supports the vertical plate portions 93A, 93B of the supporting plate connecting portion 93 so as not to shift circumferentially of the semiconductor wafer 49 (the transverse direction in FIG. 18). The supporting plates 103 directly support the vertical plate portions 93A, 93B of the supporting plate connecting member 93, and thus, indirectly support the respective contact strips 92 so as not to shift circumferentially of the semiconductor wafer 49.

The partitioning plate 104 is a plate strip that individually partitions a multiplicity of supporting plate connecting members 93. The partitioning plates 104 are disposed, respectively, at the outermost positions and between adjacent supporting plate connecting members 93. Hence, the respective partitioning plates 104 support the respective supporting plate connecting members 93 from both sides in the transverse direction. Thus, the respective partitioning plates 104 directly support the supporting plate connecting portions 93 and indirectly support the respective contact strips 92 so as to prevent the respective contact strips 92 from shifting in the direction orthogonal to the circumferential direction of the semiconductor wafer 49.

When the supporting plate connecting portions 93 are clamped from around (in the direction orthogonal to the circumferential direction of the semiconductor wafers 49 stored in the container body 12) and are supported individually by the supporting plate 103 and the partitioning plate 104, the supporting plate connecting members 93 are prevented from becoming shifted in the direction along the back surface of the lid unit, and they are movable in the direction vertical to the back surface of the lid unit.

The distance from the supporting plate 103 and the partitioning plate 104 to the supporting plate connecting member 93 is set to be a small gap so that such plates and member do not come into contact with each other when a vibration of a small magnitude occurs. In other words, when the vibration is only to such an extent that the semiconductor wafers 49 vibrate slightly, the supporting plate connecting member 93 does not contact with the supporting plates 103 and the partitioning plates 104, but deflects to absorb such a vibration. When the vibration is vigorous, the supporting plate connecting member 93 also vibrates vigorously via the contact strips 92. In this instance, the supporting plate connecting member 93 is supported upon contact with the supporting plate 103 and the partitioning plate 104.

The supporting ridge 100 described above is provided between the two supporting walls 101, 102 of the supporting rib 94. The supporting ridge 100 is a member that contacts directly with the respective supporting plate connecting members 93 and supports the same. More specifically, the center of the lateral plate portion 93C of each supporting plate connecting member 93 abuts against and is supported by the supporting ridge 100 so that both ends of the lateral plate portion 93C are freely deflectable. The supporting ridge 100 is located at a central position between the two supporting walls 101, 102 disposed in opposed paralleled relation to each other. The supporting ridge 100 extends in parallel with the supporting walls 101, 102 and has generally the same length as such walls.

Figure 27:
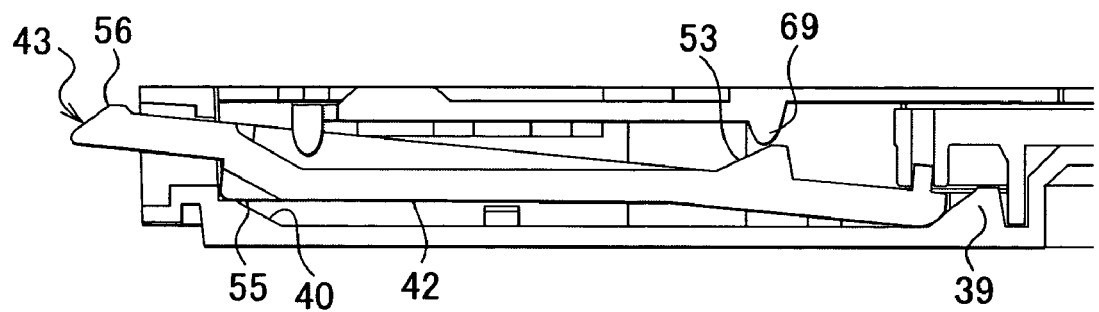
FIG. 27 is a diagram showing the operation of the simplified attaching-and-detaching mechanism according to the embodiment of the invention.
Figure 27:
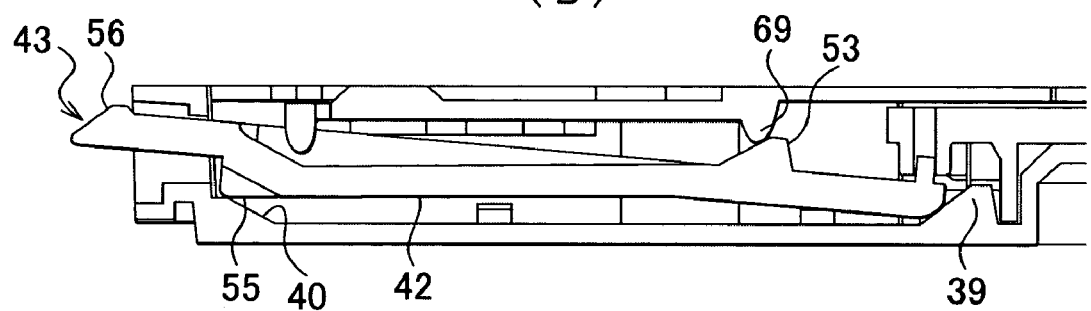
Figure 27:
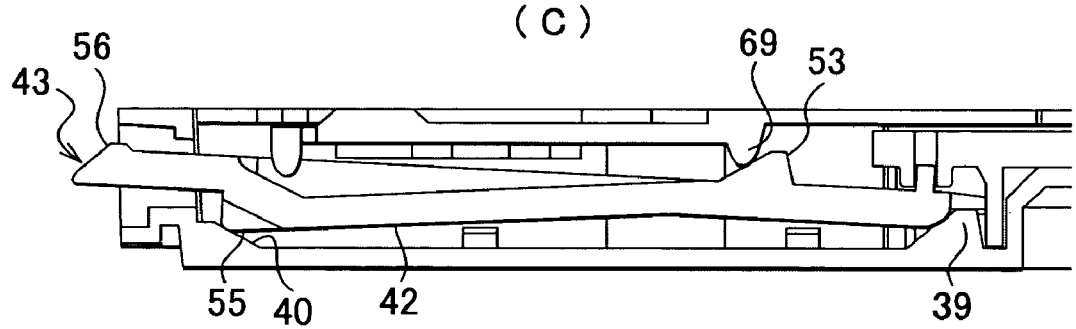
Figure 27:
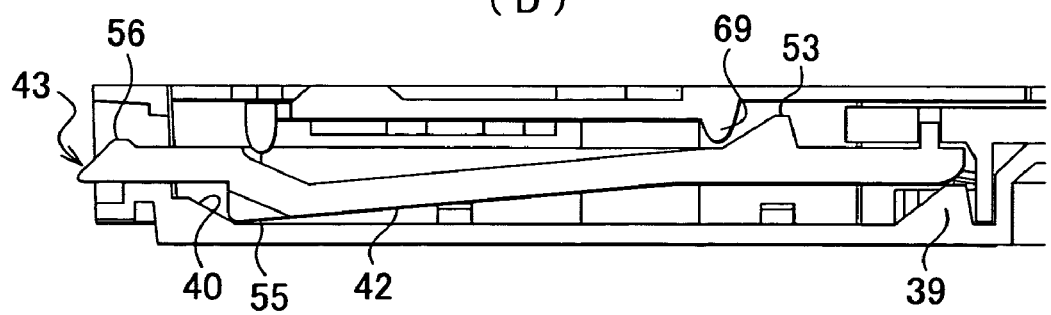

The thin-plate supporting container 11 thus structured is used as follows:

When detaching the second lid unit 15 from the container body 12, the latch key is fitted into the key groove 62 and then rotated. Thus, the feed member 44 rotates in the state shown in FIG. 27A, while the locking member 42 retracts gradually. Then, the distal sliding surface 55A of the fulcrum 55 of the locking member 42 contacts slidably with the bevel 40A of the distal cam 40, and the distal fitting portion 56 is pressed downwardly as shown in FIGS. 24B, 24C and 24D. At the same time, the proximal sliding surface 52 of the locking member 42 contacts slidably with the bevel 39A of the proximal lower cam 39, and the proximal portion of the locking member 42 is pressed upwardly. In this way, the distal fitting portion 56 is completely accommodated in the main body 30. Thereafter, the second lid unit 15 is detached from the container body 12.

The second lid unit 15 is attached to the container body 12 by lightly fitting the second lid unit 15 in the lid unit receiving portion 21 in which the latch key has been fitted in the key groove 62, and by rotating the latch key without pressing the container body 12. Thus, the locking member 42 is pressed outwardly from the main body 30 in contrast to the instance described above.

Because of outward pressing of the locking member 42, the guiding member 43 located at the extremity of the locking member 42 first reaches the second receiving device 24. More specifically, the reaching portion 43A of the guiding member 43 enters the second receiving device 24. Because the reaching portion 43A is located inwardly eccentrically of the container body 12 at the extremity of the locking member 42, the reaching portion 43A can enter the second receiving device 24 before the extremity of the locking member 42 is pressed upwardly by the cam mechanism 45. At this time, the respective semiconductor wafers 49 in the container body 12 fit in the respective V-shaped grooves 98 of the contact strips 92 of the wafer holding members 89. The peripheral portions of the respective semiconductor wafers 49 are smoothly and reliably guided by the groove bottoms along the lower surfaces 98A of the V-shaped grooves 98 that have a large area and have been rough-finished, followed by fitting in the groove bottoms. This leads to a small rotational torque of the latch key.

In this state, when the locking member 42 is further pressed outwardly from the main body 30, the fulcrum 55 of the locking member 42 contacts slidably with the bevel 40A of the distal cam 40, and the distal fitting portion 56 is pressed upwardly. Subsequently, the cam holding projection 69 abuts against the bevel 53A of the proximal upper cam 53, and the proximal portion of the locking member 42 is pressed downwardly. Thus, the proximal sliding surface 52 of the locking member 42 is pressed downwardly along the bevel 39A of the proximal lower cam 39. At the same time, the guiding portion 43B of the guiding member 43 enters the second receiving device 24 while the former is contacting slidably with the edge of the second receiving device 24, and guides the locking member 42 to the second receiving device 24. Consequently, the extremity of the locking member 42 enters the second receiving device 24 while the former is being pressed upwardly by the cam mechanism 45.

At the fulcrum 55 of the locking member 42, the distal sliding surface 55A fits in the fitting recess 40B, and the locking member 42 rotates about the fitting recess 40B.

At the proximal portion of the locking member 42, the proximal sliding surface 52 contacts slidably with the bevel 39A of the proximal lower cam 39, and the cam holding projection 69 abuts against the bevel 53A of the proximal upper cam 53, thereby pressing the proximal portion of the locking member 42 downwardly.

Accordingly, the locking member 42 serves as a lever with a point of support at the fulcrum 55 which has fitted in the fitting recess 40B, and brings the second lid unit 15 into forcibly pressed condition toward the container body 12 in a state in which the distal fitting portion 56 fits in the second receiving device 24 of the lid receiving portion 21.

At this time, the semiconductor wafer 49 is forcibly pressed toward the thin-plate supporting unit 13 in the container body 12 by the wafer holding member 89. However, since the surface of the V-shaped groove 25C of the thin plate supporting unit 13 has been rough-finished, the peripheral portion of the semiconductor wafer 49 fits smoothly into the groove bottom along the bevel of the V-shaped groove 25C. The other sliding portions have also been roughly finished on their respective surfaces so that smooth sliding movements are provided. Moreover, the rotational torque of the latch key can be reduced.

This method of mounting the second lid unit 15 is effectively applicable to the instances where the container body 12 is oriented either vertically or laterally. When the container body 12 is laterally oriented to take in and out the semiconductor wafers 49, this container body is simply placed on a working table, but is not fixed. In the conventional art, therefore, it has been difficult to automate attachment and detachment of the lid member 15. As described above, this embodiment of the present invention has made it possible to attach the lid unit 15 to the container body 12 laterally oriented with no appreciable pressing imposed on the latter. Hence, the attaching-and-detaching operation of the lid unit 15 can be automated using the existing attaching-and-detaching device.

In other words, according to the thin-plate supporting container of the above-described embodiment, the following advantages are achieved.

1. Since the guiding member 43 guides the locking member 42 to the receiving device 24, allowing the locking member 42 to fit in the receiving device 24 in a state in which the main body 30 fits lightly in the container body 12 generally without pressing the container body 12, the lid unit can be easily attached with no need for fixing the container body 12. Hence, the attaching-and-detaching operation of the lid unit 15 can be automated using the existing attaching-and-detaching device.

2. Since the reaching portion 43A of the guiding member 43 reaches the receiving device 24, and the guiding portion 43B guides the locking member 42 into the receiving device 24, the attaching-and-detaching operation of the lid unit can be automated using the existing attaching-and-detaching device in the same manner as described above.

3. Since the projection on the reaching portion 43A engages with the receiving device 24, and the bevel of the guiding portion 43B guides the locking member 42 into the receiving device 24 along the edge of the receiving device 24, the lid unit 14 can be easily attached to the container body 12 with no need for fixing the container body 12. Hence, the attaching-and-detaching operation of the lid unit can be automated using the existing attaching-and-detaching device in the same manner as described above.

4. Since the locking member 42 is smoothly guided into the receiving device 24 by rough-finishing the surface of the bevel of the guiding portion 43B, the rotational torque of the latch key can be minimized. Hence, the attaching-and-detaching operation of the lid unit can be automated using the existing attaching-and-detaching device in the same manner as described above.

5. Since the locking member 42 is smoothly guided into the receiving device 24 by rough-finishing the sliding surfaces of the respective sliding portions of the simplified attaching-and-detaching mechanism 32, the rotational torque of the latch key can be minimized. Hence, the attaching-and-detaching operation of the lid unit can be automated using the existing attaching-and-detaching device in the same manner as described above.

6. Since the peripheral portion of the semiconductor wafer 49 fits in the groove bottom along the bevel of the V-shaped groove 25C, the surface of which has been rough-finished, the attaching-and-detaching operation of the lid unit can be automated using the existing attaching-and-detaching device in the same manner as described above.

7. Since the frictional resistances of the respective sliding portions are reduced by molding the bevel and the like with a synthetic resin incorporated with a sliding agent, the rotational torque of the latch key can be minimized. Hence, the attaching-and-detaching operation of the lid unit can be automated using the existing the attaching-and-detaching device in the same manner as described above.

Modified embodiments of the present invention will be described below.

Figure 28:
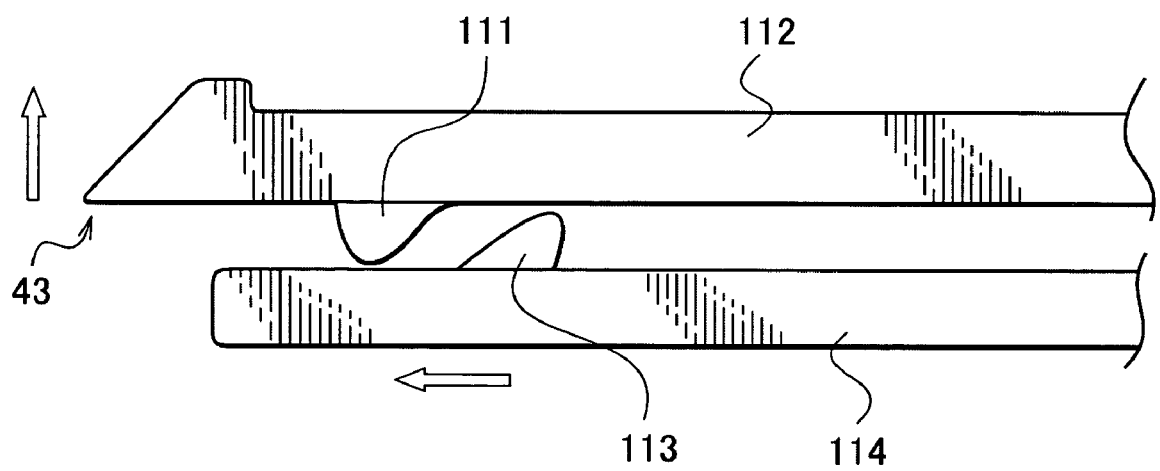
FIG. 28 is a side view showing a modified embodiment of the invention.

1. In the first-mentioned embodiment, the distal cam 40 and the proximal cam 53 are provided as members for the cam mechanism 45 for lifting the locking member 42. The cam mechanism may be structured to include only the distal cam 40, or may be structured to have any other different forms. For example, as shown in FIG. 28, a cam mechanism may include a locking member 112 provided with a projection 111 on the lower side at the extremity thereof, and a sliding plate 114 provided with a cam 113. In this modification, the locking member 112 and the sliding plate 114 are allowed to extend simultaneously such that the extremity of the locking member 112 first inserts into the second receiving device 24, and then the sliding plate 114 further extends with the result that the extremity of the locking member 112 lifts in the second receiving device 24 and fixes the lid unit 15 to the container body 12. In addition to the modified cam mechanism described here, the present invention can be applied to all the cam mechanisms having such a structure that the locking member 42 extends to engage with the second receiving device 24.

Even in such an instance, the same operation and advantages as in the first-mentioned embodiment are achieved.

2. In the first-mentioned embodiment, the guiding portion 43B of the guiding member 43 is formed in the shape of a linear flat surface. A curved shape is also acceptable. The surface shapes of the guiding portion 43B are not particularly limited so long as the surface is of a shape capable of entering the second receiving device 24 while the surface is sliding on contact with the edge of the second receiving device 24. Hence, surface shapes such as of plane, curved, convex and concave are suitably useful. Even in such an instance, the same operation and advantages as in the first-mentioned embodiment are achieved.

3. In the first-mentioned embodiment, the sliding surfaces of the thin-plate supporting portions 13, the simplified attaching-and-detaching mechanism 32, the wafer holding member 89 and the like (the surfaces of the V-shaped grooves 25C and the like) are rough-finished to minimize frictional resistances. Materials themselves used in molding those sliding surfaces may be suitably selected. To minimize frictional resistance, use may be made of synthetic resins incorporated with a sliding agent (an additive for plastic use). The sliding agent includes PTFE, PFA, silicon, glass fiber, carbon fiber, graphite and molybdenum disulfide. The additives listed here may be added, singly or in combination, in an amount of about 10 to 20%, to an engineering plastic such as PBT or POM as a matrix polymer. However, because the combination and/or mixing ratio of the additives are variable with the type of an engineering plastic used, the optimum parameters should be determined through experiments or the like.

Thus, the frictional resistances on the sliding surface are reduced, and this enables the attachment of the lid unit 15 to the container body 12 and the operation of the simplified attaching-and-detaching mechanism 32 to be efficiently performed. Consequently, the lid unit 15 can be easily attached to the container body 12, even when oriented laterally, without appreciable pressing imposed on the container body, and the attaching-and-detaching operation of the lid unit 15 can be automated by the use of the existing attaching-and-detaching device.

What is claimed is:

1. A lid unit for closing a container body of a portable thin plate supporting container in which a plurality of thin plates are housed, with a gasket interposed between the lid unit and the container, said lid unit having opposing inner and outer surfaces and comprising:
   on said outer surface, at least one simplified attaching and detaching mechanism for removably attaching the lid unit to the container body, said attaching and detaching mechanism comprising:
   a locking member having upper and lower opposing surfaces and slidably mounted on a planar surface of a body portion of the lid unit for linear movement between an extended position engaged within an opening in a rim of the container body to secure the lid unit to the container body and a retracted position allowing the lid unit to be removed from the container body, the locking member having a distal end disposed at the extremity of the locking member, the distal end reaching the receiving structure in a state in which the lid unit lightly contacts the container body without forcibly pressing the lid unit against the container body and guides the locking member into the receiving device, wherein the distal end is beveled to provide a surface inclined to the upper and lower surfaces, the inclined surface extending from a tip of the distal end of the locking member and extending away from the bottom surface to form a distal fitting portion on the upper surface, the inclined surface serving as a guiding portion for slidably engaging an edge of the opening in the rim of the container body as the locking member is extended, whereby the lid unit is pressed inwardly;
   on the outer surface, a rotary actuator which is connected to the locking member for, responsive to rotation, moving the locking member linearly between its extended and retracted positions;
   on the inner surface, a wafer holding unit for resiliently supporting peripheral portions of the thin plates to prevent the thin plates from contacting each other; and
   cam means for forcing a proximal end of the locking member downward and the distal end of the locking member upward as the locking member is extended into the opening in the rim of the container body, pressing the lid unit against the container.

2. The lid unit according to claim 1 wherein the inclined surface is flat.

3. The lid unit for a thin plate supporting container according to claim 1, wherein the cam means comprises:
   distal and proximal cams spaced apart on the upper surface of the lid unit and having cam surfaces oblique to the upper surface, the proximal end of the locking member sliding on the cam surface of the proximal cam and a fulcrum on the lower surface of the locking member sliding on the cam surface of the distal cam, as the locking member is extended and retracted;
   a proximal upper cam on the upper surface of the locking member; and
   a projection extending from the lower surface of the cover member into contact with the proximal upper cam which slides in contact with the projection as the locking member is extended and retracted,
   whereby the projection forces the proximal end of the locking member downward and the distal cam forces the distal end of the locking member upward as the locking member is extended.

4. The lid unit for a thin plate supporting container according to claim 3 wherein the locking member has a post extending from its upper surface and wherein the rotary actuator has a camming slot in which the post is fitted for translating the rotational motion of the rotary actuator into the linear motion of the locking member through the post.

5. The lid unit for a thin plate supporting container according to claim 3 wherein the cover member houses the rotary member for rotation relative thereto and the locking member for the linear movement relative thereto.

6. The lid unit for a thin plate supporting container according to claim 5 wherein the cover member comprises a round holding portion housing the rotary actuator and a linear locking member holding portion extending from the round portion, the locking member holding portion having side walls and covering the top and sides of a longitudinal portion of the locking member.

7. The lid unit for a thin plate supporting container according to claim 5 additionally comprising:
   a cover holding member which fits over the over the locking member holding portion and which includes a top plate, side plates integral with and extending from the top plate, and lower supporting strips extending laterally from distal ends of the side plates: and
   L-shaped members extending upward from the upper surface of the lid unit and engaging the lower supporting strips to fix the cover holding member and the cover member to the planar surface of the body portion of the lid unit.

8. A lid unit for a thin plate supporting container according to claim 1, wherein the beveled surface of the guiding portion is rough-finished.

9. A lid unit for a thin plate supporting container according to claim 1, wherein the locking member has a sliding surface which is rough-finished.

10. A lid unit for a thin plate supporting container according to claim 1, wherein the wafer holding unit has V-shaped grooves receiving and supporting peripheries of thin plates received in the container body, wherein the V-shaped grooves are defined by bevel surfaces which are rough-finished.

11. A lid unit for a thin plate supporting container according to claim 1, wherein at least the locking member has a sliding surface formed from a synthetic resin containing a sliding agent.

12. A lid unit for a thin plate supporting container according to claim 1, wherein the wafer holding unit has V-shaped grooves receiving and supporting peripheries of thin plates received in the container body, wherein the V-shaped grooves are defined by bevel surfaces which are formed from a synthetic resin containing a sliding agent.

13. A lid unit for a thin plate supporting container according to claim 11, wherein the sliding agent is at least one member selected from the group consisting of PTFE, PFA, silicon, glass fiber, carbon fiber, graphite and molybdenum disulfide.

14. A lid unit for a thin plate supporting container according to claim 12, wherein the sliding agent is at least one member selected from the group consisting of PTFE, PFA, silicon, glass fiber, carbon fiber, graphite and molybdenum disulfide.

15. The lid unit for a thin plate supporting container according to claim 1 wherein the cam means includes a distal cam extending from and having a surface oblique to the upper surface of the lid unit, a first contact portion of the locking member sliding on the oblique surface in the linear movement, the distal cam lifting the guiding portion of the locking member upward as the locking member is extended.

16. The lid unit for a thin plate supporting container according to claim 1 wherein the inclined surface on the distal end extends from the tip beyond the upper surface whereby the distal end is enlarged.

17. The lid unit for a thin plate supporting container according to claim 1 wherein the inclined surface on the distal end extends from the tip beyond the upper surface whereby the distal end is enlarged.

\* \* \* \* \*